(12) United States Patent
Cronin et al.

(10) Patent No.: US 12,738,590 B2
(45) Date of Patent: Sep. 15, 2026

(54) BATTERY CELL AND BATTERY DEVICE HAVING THE SAME

(71) Applicant: SK On Co., Ltd., Seoul (KR)

(72) Inventors: John Cronin, Jericho, VT (US); Yong Bok Moon, Daejeon (KR); Soo Min Park, Daejeon (KR); Hyung Ju Paik, Daejeon (KR); Hae Ryong Jeon, Daejeon (KR)

(73) Assignee: SK On Co., Ltd., Seoul (KR)

( * ) Notice: Subject to any disclaimer, the term of this patent is extended or adjusted under 35 U.S.C. 154(b) by 583 days.

(21) Appl. No.: 18/360,807

(22) Filed: Jul. 28, 2023

(65) Prior Publication Data

US 2024/0195005 A1 Jun. 13, 2024

Related U.S. Application Data

(60) Provisional application No. 63/430,887, filed on Dec. 7, 2022.

(51) Int. Cl.

| | |
|---|---|
| ***H01M 50/308*** | (2021.01) |
| ***B81B 5/00*** | (2006.01) |
| ***H01M 10/48*** | (2006.01) |

(52) U.S. Cl.

CPC ............. *H01M 50/308* (2021.01); *B81B 5/00* (2013.01); *H01M 10/48* (2013.01); *B81B 2201/032* (2013.01)

(58) Field of Classification Search

CPC ...................... H01M 50/30–394; H01M 10/52

See application file for complete search history.

(56) References Cited

U.S. PATENT DOCUMENTS

| | | | | |
|---|---|---|---|---|
| 268,308 | A * | 11/1882 | Starr | H01M 50/3425 |
| 2,374,513 | A * | 4/1945 | Vieth | H01M 50/308 429/84 |
| 4,177,327 | A * | 12/1979 | Mathews | H01M 6/50 429/444 |
| 4,493,880 | A * | 1/1985 | Lund | H01M 50/50 429/513 |
| 5,449,569 | A * | 9/1995 | Schumm, Jr. | H01M 50/583 429/402 |
| 8,383,256 | B1 * | 2/2013 | Fu | F16K 99/0001 429/170 |
| 2003/0027036 | A1 * | 2/2003 | Emori | H01M 10/42 337/16 |
| 2011/0269000 | A1 * | 11/2011 | Suzuki | H01M 50/3425 29/890.132 |
| 2022/0069269 | A1 * | 3/2022 | Ryu | H01M 50/121 |

* cited by examiner

*Primary Examiner* — Haroon S. Sheikh

(74) *Attorney, Agent, or Firm* — IP & T GROUP LLP

(57) ABSTRACT

A battery cell includes a case accommodating an electrode assembly, a cap plate covering the case, an electrode terminal disposed on the cap plate and electrically connected to the electrode assembly, and a venting part including an active venting device configure to be opened to discharge gas from inside the case according to an electrical signal generated under a preset condition.

19 Claims, 21 Drawing Sheets

300
110
112
106a
106
100

300
128
126
120
110
112
106

300
128
126
120
110
118
112
106

300
118a
128
120
126
118b
110
112
106

300
128
118c
120
126
118d
110
118c
112
106

300
126
120

126
112
106

BATTERY CELL AND BATTERY DEVICE HAVING THE SAME

CROSS-REFERENCE TO RELATED APPLICATION (S)

This patent document claims the benefit of U.S. Provisional Patent Application No. 63/430,887 filed on Dec. 7, 2022, the disclosure of which is incorporated herein by reference in its entirety.

TECHNICAL FIELD

The technology and implementations disclosed in this patent document generally relate to a battery cell capable of being charged with and discharged of electricity, and more particularly, to a battery cell capable of increasing safe operation and a battery device including the same.

BACKGROUND

Battery cells may have issues with a temperature rise when excessive heat and pressure builds up inside a can (case) thereof. An increase in battery cell temperature may compromise the functional safety and reliability of battery cells.

In addition, when various events occur, such as when a battery cell reaches the end of a lifespan thereof, when a swelling phenomenon occurs in a battery cell, when an overcharge occurs in a battery cell, when a battery cell is exposed to heat, when a sharp object such as a nail penetrates the case of a battery cell, and when an external shock is applied to a battery cell, the temperature of the battery cell may increase, and a fire may accordingly occur. A flame or high-temperature gas ejected from a battery cell may cause chain ignition of other, adjacent battery cells accommodated in a battery device.

SUMMARY

The disclosed technology can be implemented in some embodiments to provide a battery cell that may stably operate even when overcharging or an abnormality occurs in the battery cell, and a battery device including the same.

The disclosed technology can be implemented in some embodiments to provide a battery device that may control an operation of a battery cell when a problem such as an instantaneous current rise or the like occurs in the battery cell.

The disclosed technology can be implemented in some embodiments to provide a battery cell in which a thermal runaway phenomenon in which flames are sequentially propagated from a battery cell in which an event occurs to an adjacent battery cell may be delayed or reduced, and a battery device including the same.

In some embodiments of the disclosed technology, a battery cell includes a case accommodating an electrode assembly; a cap plate covering the case; an electrode terminal disposed on the cap plate and electrically connected to the electrode assembly; and a venting part including an active venting device configure to be opened to discharge gas from inside the case according to an electrical signal generated under a preset condition.

In embodiments, the active venting device may include a Micro-Electro-Mechanical System (MEMS)-based actuator or a MEMS-based piezoelectric actuator.

In embodiments, the active venting device may include a piezoelectric microvalve or a MEMS-based piezoelectric microvalve.

In embodiments, the active venting device may include an actuator configured to operate by receiving power from the electrode terminal.

In embodiments, the active venting device may include an inlet through which gas generated inside the case is introduced, an outlet through which the gas introduced from the inlet is discharged, an actuator configured to operate to open the outlet, and a power supply unit supplying power to the actuator, and the power supply unit may be electrically connected to the electrode terminal.

In embodiments, the active venting device may further include a first sensor configured to sense current flowing through the electrode terminal, and the actuator may be configured to operate when the current sensed by the first sensor is greater than a threshold value.

In embodiments, the electrode terminal may include an anode terminal and a cathode terminal, and the first sensor may be electrically connected to the anode terminal and the cathode terminal, respectively.

In embodiments, the active venting device may further include a first sensor configured to sense a voltage of the electrode terminal, and the actuator may be configured to operate when the voltage sensed by the first sensor is greater than a threshold value.

In embodiments, the active venting device may include a second sensor configured to sense at least one of pressure and temperature inside the case, and the actuator may be configured to operate when the pressure or the temperature sensed by the second sensor is greater than a threshold value.

In embodiments, at least one of the cap plate and the case may include a venting hole through which the gas inside the case is discharged externally, and the active venting device may be disposed in an internal space of the case.

In embodiments, an outlet of the active venting device may be disposed to face the venting hole.

In embodiments, the electrode terminal may include an anode terminal connected to an anode foil of the electrode assembly and a cathode terminal connected to a cathode foil of the electrode assembly, the venting hole may be disposed between the anode terminal and the cathode terminal, and the active venting device may be disposed in a space between the anode foil and the cathode foil, to face the venting hole.

In embodiments, the venting part may include the active venting device and a vent cover covering the venting hole, and an outlet of the active venting device may be disposed to face the vent cover.

In embodiments, the active venting device may include n inlet through which the gas generated inside the case is introduced, and an actuator operating to open the outlet. The outlet may be configured to discharge the gas introduced from the inlet. Between the outlet and the vent cover, a buffer space may be provided to accommodate the gas discharged from the outlet.

In embodiments, the vent cover may be opened when pressure inside the buffer space is equal to or greater than a set pressure.

In embodiments, the active venting device may include an inlet through which the gas generated inside the case is introduced, an outlet through which the gas introduced from the inlet is discharged, and an actuator operating to open the outlet, and the gas generated inside the case may be discharged externally through the venting hole by opening the outlet.

In embodiments, at least one of the cap plate and the case may include a venting hole through which the gas inside the case is discharged externally, and the active venting device may be installed to be exposed externally of the cap plate or the case through the venting hole.

In embodiments, the active venting device may include a casing having an inlet and an outlet, and an actuator accommodated inside the casing and configured to operate to open the outlet, and the casing may be installed in the venting hole.

In some embodiments of the disclosed technology, a battery device includes a plurality of battery cells; a housing accommodating the plurality of battery cells; and a controller connected to at least one of the plurality of battery cells and controlling at least one of the plurality of battery cells. The plurality of battery cells include a case accommodating an electrode assembly, a cap plate covering the case, an electrode terminal disposed on the cap plate and electrically connected to the electrode assembly, and a venting part including an active venting device configured to be opened to discharge gas from inside the case according to an electrical signal generated under a preset condition. The controller controls an operation of at least one of the battery cells when the active venting device disposed in the at least one of the plurality of battery cells operates.

In embodiments, the active venting device may further include an inlet through which the gas generated inside the case is introduced, an outlet through which the gas introduced from the inlet is discharged, an actuator configured to operate to open the outlet, and a first sensor configured to sense current flowing through the electrode terminal. The actuator may be configured to operate when the current sensed by the first sensor is greater than a threshold value, and the controller may perform current balancing for at least one of the plurality of battery cells when the current sensed by the first sensor is greater than the threshold value.

According to one embodiment, even when overcharging or abnormality occurs in the battery cell, the battery cell may be the stably operated.

According to one embodiment, it is possible to control the battery cell and the battery device when a problem such as an instantaneous increase in current occurs in the battery cell.

According to one embodiment, thermal runaway in which flames are sequentially propagated from a battery in which an event occurs to an adjacent battery cells may be delayed or reduced.

BRIEF DESCRIPTION OF DRAWINGS

Certain aspects, features, and advantages of the disclosed technology are illustrated by the following detailed description with reference to the accompanying drawings.

FIGS. 6A and 6B are graphs illustrating overcharge states of battery cells according to one embodiment, in which FIG. 6A is a graph illustrating the temperature of a battery cell over time during an overcharge test, and FIG. 6B is a graph illustrating the voltage of a battery cell over time during an overcharge test.

FIGS. 7A to 7C illustrate Microelectromechanical System (MEMS)-based piezoelectric microvalves according to one embodiment, in which FIG. 7A is a cross-sectional view illustrating a MEMS-based piezoelectric microvalve in a closed position, FIG. 7B is a cross-sectional view illustrating a MEMS-based piezoelectric microvalve in an open position, and FIG. 7C is a partially cut-away perspective view illustrating a MEMS-based piezoelectric microvalve integrated into a battery cell.

FIGS. 9A and 9B illustrate a top cap assembly and a venting part in the battery cell of FIG. 8, in which FIG. 9A is a perspective view viewed from the upper side, and FIG. 9B is a perspective view viewed from the lower side.

FIGS. 11A and 11B are enlarged views of part "A" in FIG. 10, in which FIG. 11A is a cross-sectional view illustrating an active venting device in a closed position, and FIG. 11B is a cross-sectional view illustrating an active venting device in an open position.

FIGS. 13A and 13B illustrate a modified example of a top cap assembly and a venting part, in which FIG. 13A is a perspective view viewed from the upper side, and FIG. 13B is a perspective view viewed from the lower side.

FIGS. 15A and 15B are enlarged views of part "B" of FIG. 14, in which FIG. 15A is a cross-sectional view illustrating an active venting device in a closed position, and FIG. 15B is a cross-sectional view illustrating an active venting device in an open position.

DETAILED DESCRIPTION

Figure 1:
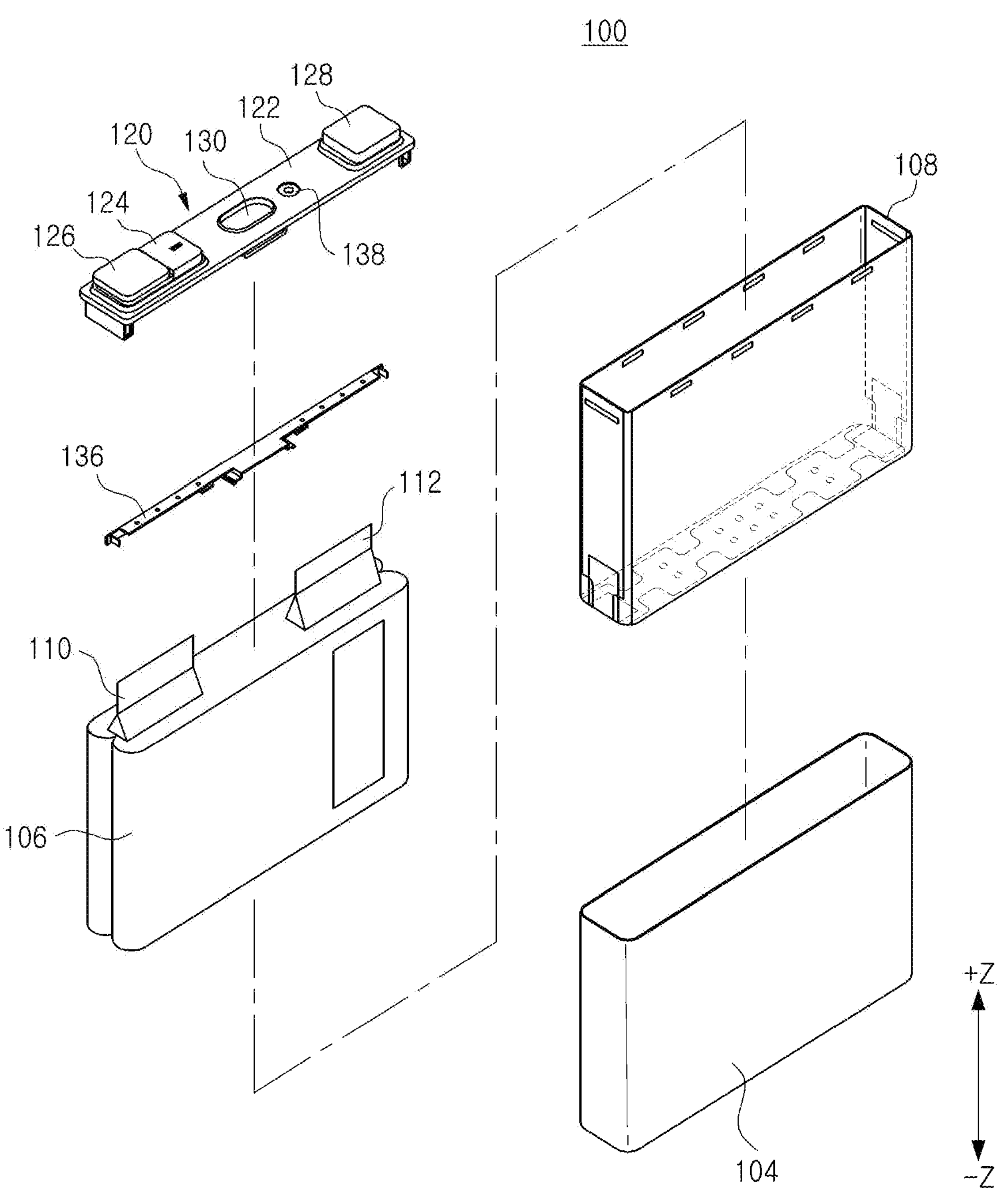
FIG. 1 is an exploded perspective view of a battery cell according to one embodiment.

Features of the disclosed technology disclosed in this patent document are described by example embodiments with reference to the accompanying drawings.

Embodiments of the disclosed technology will be more fully described below with reference to the accompanying drawings, and like numbers indicate like elements throughout the several views, and example embodiments are illustrated. However, embodiments of the claims may be implemented in many different forms and are not limited to the embodiments described herein. The examples given herein are non-limiting and only examples among other possible examples.

In the following description, 'including' a certain element means that other elements may be further included, rather than excluding other elements unless otherwise stated.

In addition, terms including ordinal numbers such as "first" and "second" used in this specification may be used to describe various components, and the components are not limited by the terms. These terms are only used for the purpose of distinguishing one component from another. For example, a first component may be termed a second component without departing from the scope of the disclosed technology, and similarly, the second element may also be termed the first element.

It should be noted that in the accompanying drawings, like elements are indicated by the same reference numerals as much as possible. In addition, detailed descriptions of well-known functions and configurations that may obscure the gist of the disclosed technology will be omitted. For the same reason, in the accompanying drawings, some components are exaggerated, omitted, or schematically illustrated, and the size of each component does not entirely reflect actual size.

FIG. 1 is an exploded perspective view of a battery cell according to an embodiment.

Referring to FIG. 1, a battery cell 100 may be a prismatic cell. Prismatic cells are widely used in powertrains of electric vehicles. The prismatic cells may be stacked together in a rectangular shape, allowing more efficient use of space. Prismatic cells are generally rectangular and have a higher power density than cylindrical cells. Prismatic cells also provide better performance in cold weather and less damage from vibration. However, prismatic cells may be more expensive to manufacture than cylindrical cells. In addition, prismatic cells are less likely to fail due to vibration or movement. Prismatic cells may deliver more power than cylindrical battery cells due to spatial optimization of the rectangular shape thereof.

The prismatic battery cell 100 includes a rectangular can 104 that may be formed of steel, aluminum, aluminum alloy, plastic, or other metals having sufficient structural strength. The can 104 may be manufactured according to various different methods including deep draw or impact extrusion. The method for manufacturing the can 104 may be combined with wall ironing to achieve the final geometry, thickness and tolerances. The can 104 may be wrapped with cell cover tape.

A jelly roll 106 includes a stacked anode, cathode and separator. A jelly roll 106 type electrode assembly configured to have a structure of a long sheet type cathode and a long sheet type anode to which an active material is applied is wound. At the same time, the stacked-type electrode assembly has a structure in which a separator is disposed between a cathode and an anode or has a structure in which a plurality of cathodes and anodes having a predetermined size are sequentially stacked and a separator is disposed between each of the cathodes and the anode. The jelly roll-type electrode assembly is easy to manufacture and has high unit mass and energy density, compared to a sheet-type electrode assembly. In some batteries, one or more jelly rolls 106 are inserted into can 104. Each jelly roll (electrode assembly) 106 is inserted inside the can 104 while being accommodated in a polymer jelly roll bag 108 or wrapped in a jelly roll sealing tape.

Each jelly roll 106 includes a cathode foil 112 formed of aluminum. The aluminum foil is coated with the electrode slurry. A first operation of electrode manufacturing is a slurry mixing process in which an active raw material is combined with a binder, a solvent and an additive. This mixing process should be performed separately for anode and cathode slurries. Viscosity, density, solids content and other measurable properties of the slurry affect battery quality and electrode uniformity. For example, a slurry having a faster drying rate, a higher solids content, a lower rate capability, and a low viscosity is generated as a solvent content is higher. Thereafter, the cathode slurry is applied to an aluminum foil and dried. A slot die coater is a method of coating a foil in which a slurry is spread through slot gaps on the moving foil receiving tension over rollers. In some embodiments, this may be performed simultaneously on both sides of the foil. This production method enables high speed, while achieving precision in coating thickness. A drying process may be incorporated into a continuous coating. The drying process should achieve three objectives: diffusion of the binder, sedimentation of particles, and evaporation of the solvent. Air floatation is a method of drying the slurry on the foil. Uniformity of the electrode coating and drying process affects the safety, consistency and life cycle of the prismatic battery cell 100. The electrode should go through a calendering process in which electrode porosity and twist are controlled by compressing the coated electrode sheet to a uniform thickness and density.

Each jelly roll 106 includes an anode foil 110 formed of copper foil. The anode foil 110 is provided similarly to a cathode foil 112. Each jelly roll 106 may include a cathode connector (not shown) that makes an electrical connection between the inner end portion of the cathode foil 112 and the cathode terminal 128. Each jelly roll 106 may include an anode connector (not shown) that makes an electrical connection between the inner end portion of the anode foil 110 and an anode terminal 126. Each jelly roll 106 may include a cathode connector mask (e.g., a cathode connector mask 118 in FIG. 3C).

Each prismatic battery cell 100 may have a top cap assembly (upper cap assembly) 120 welded or otherwise bonded to the top of the can 104. The top cap assembly 120 may include a base plate 122 attached to the can 104. The base plate 122 isolates the inside and outside of the cell by welding with the can 104. The base plate 122 may serve as a rigid support structure for elements within the top cap assembly 120. The top cap assembly 120 may include a plurality of top insulators 124 to insulate the base plate 122. The top insulator 124 may prevent leakage of an electrolyte from the prismatic battery cell 100.

Additionally, the top insulator 124 may isolate the can 104 from the cathode foil 112 and prevent penetration of moisture and gases from the outside of the cell. A portion of the top insulator 124 may protect a current interrupting device. The top cap assembly 120 includes a cathode terminal 128 electrically connecting the inside and outside of the prismatic battery cell 100. The top cap assembly 120 includes an anode terminal 126 electrically connecting the inside and outside of the prismatic battery cell 100.

The top cap assembly 120 may include a vent cover 130 allowing exhaust gases from the prismatic battery cell 100 to be discharged in a controlled direction and at a controlled pressure. The top cap assembly 120 may include a vent guard 132 protecting the vent cover 130 from the inside of the prismatic battery cell 100 in order to prevent the vent cover 130 from malfunctioning. The top cap assembly 120 may include an overcharge safety device 134 preventing an external current from being introduced using an internal gas pressure of the prismatic battery cell 100. The top insulator 124 may be multi-component. In some embodiments, side portions of the top insulator 124 may be mounted on the edges of the can 104 and the top cap assembly 120. Once the prismatic battery cell 100 is configured, an electrolyte solution may be injected through an electrolyte injection port. An electrolyte cap 138 may close or seal the injection port.

The battery cell 100 may include an insulator 136 located between the top cap assembly 120 and the can 104.

In this document, the electrode assembly of the battery cell 100 is described as the jelly roll 106, but the electrode assembly of the battery cell 100 is not limited to the jelly roll 106. For example, the jelly roll 106 may be replaced with a stack type electrode assembly or a Z-folding type electrode assembly. According to an embodiment, the jelly roll 106 described herein may refer to an electrode assembly.

In this document, the can 104 may be referred to as a case or housing.

Figure 2A:
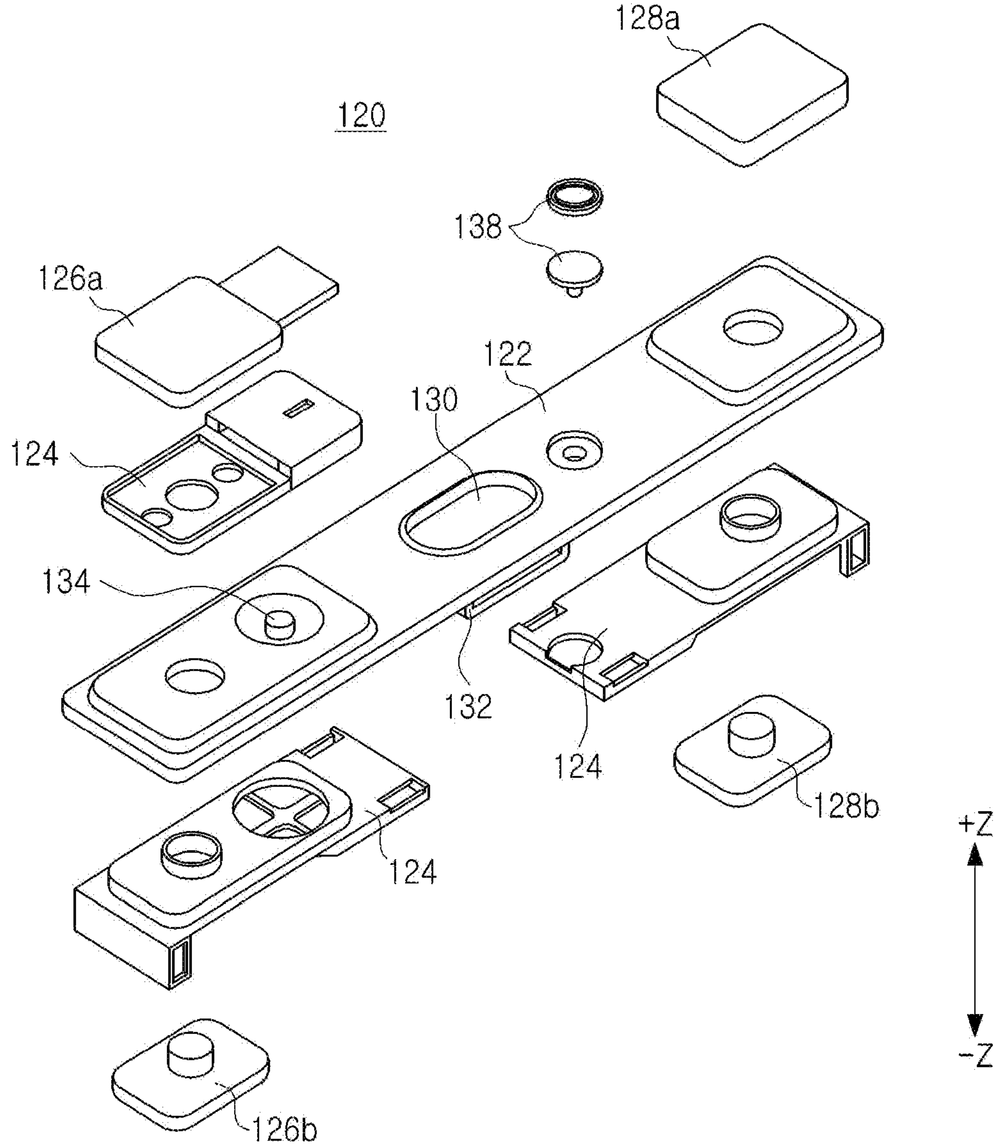
FIGS. 2A, 2B, and 2C are views for illustrating a top cap assembly according to one embodiment.
Figure 2B:
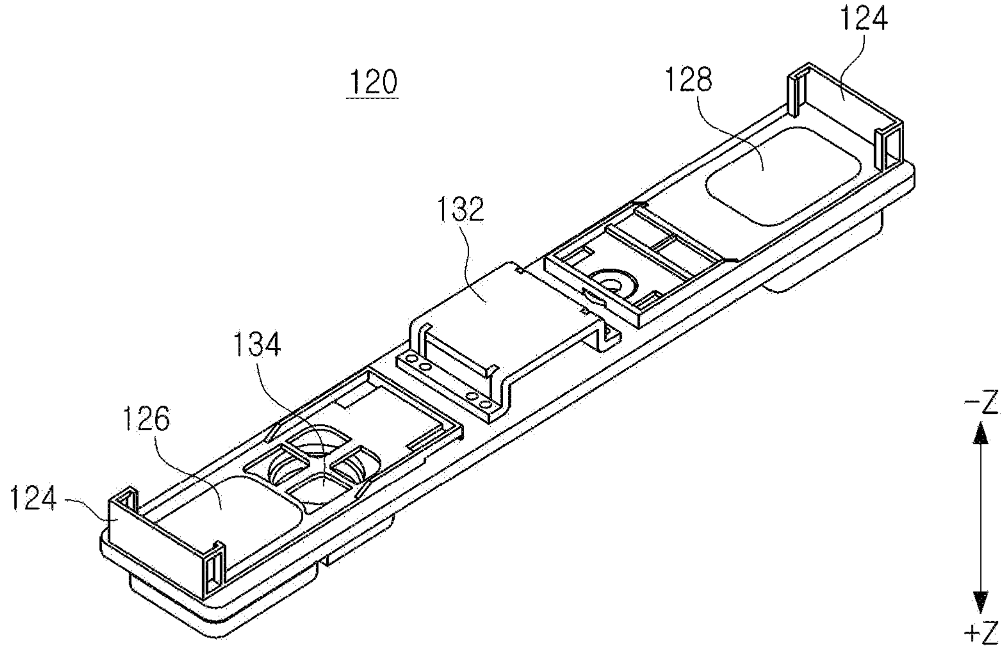
Figure 2C:
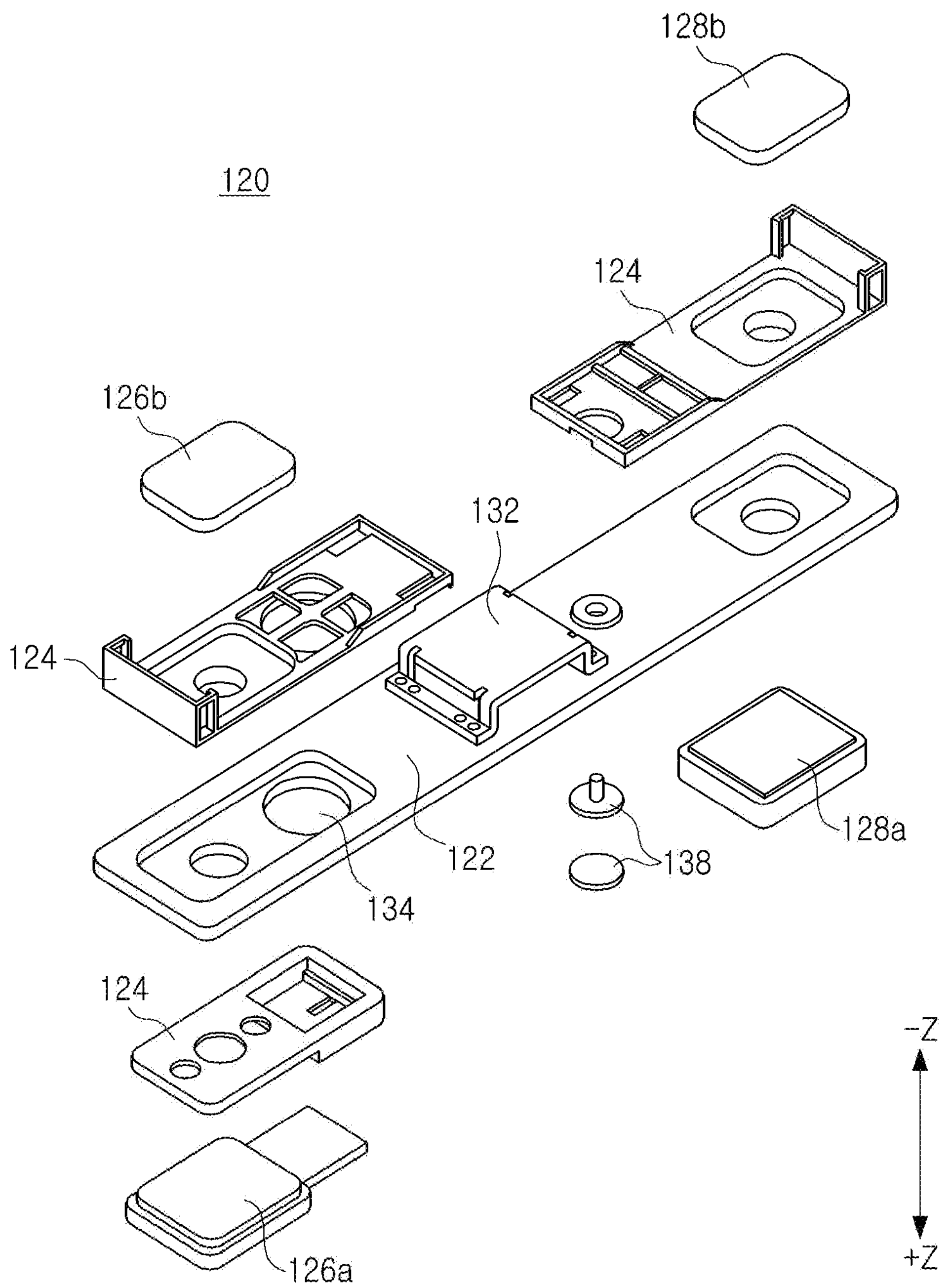

FIGS. 2A, 2B and 2C show a configuration and component functions of the top cap assembly 120. For example, FIG. 2A is an exploded perspective view of the top cap assembly 120 according to an embodiment of the present disclosure. FIG. 2B is a rear perspective view of the top cap assembly 120 according to an embodiment of the t present disclosure. Description of the top cap assembly 120 of FIG. 1 may be applied to the top cap assembly 120 of FIGS. 2A, 2B and 2C.

The top cap assembly 120 serving as a cover for the prismatic battery cell 100 is a complex assembly including a plurality of welded components. Adhesives may be used instead of welding specific components.

The prismatic battery cell 100 may include the vent cover 130. The vent cover 130 provides overpressure alleviation when temperature and corresponding pressure increase in the prismatic battery cell 100. For example, the vent cover 130 may be activated in a preset pressure range. The vent cover 130 may be laser-welded to the top cap assembly 120.

The prismatic battery cell 100 may include the can 104. The can 104 may generally be formed of deep-drawn aluminum or stainless steel to prevent moisture from entering the cell, while providing diffusion resistance to organic solvents, such as liquid electrolytes. The most important reason the can 104 is typically formed of deep-drawn aluminum alloy or stainless steel is to reduce a welding point to improve the mechanical strength of the can 104. The electrolyte may be filled in the prismatic battery cell 100 through an injection port. After the electrolyte is filled, the injection port may be closed or sealed by an electrolyte cap 138. After electrolyte filling, the electrolyte cap 138 may be welded to the top cap assembly 120 or a locking ball (not shown) may be forced into the injection port. The cell may have an overcharge safety device 134 that may disconnect current flow when high internal pressure is reached in the prismatic battery cell 100. A rise in pressure is usually a result of high temperatures.

According to an embodiment, the cathode terminal 128 may be provided in plural. For example, the cathode terminal 128 may include a first cathode terminal 128*a* in which at least a portion is exposed to the outside of the battery cell 100 and a second cathode terminal 128*b* connected to a cathode foil (e.g., the cathode foil 112 of FIG. 1). The second cathode terminal 128*b* may be electrically connected to the first cathode terminal 128*a*. For example, a portion of the second cathode terminal 128*b* may contact the first cathode terminal 128*a*.

According to an embodiment, the anode terminal 126 may be provided in plural. For example, the anode terminal 126 may include a first anode terminal 126*a* in which at least a portion is exposed to the outside of the battery cell 100 and a second anode terminal 126*b* connected to an anode foil (e.g., the anode foil 110 of FIG. 1). The second anode terminal 126*b* may be electrically connected to the first anode terminal 126*a*. For example, a portion of the second anode terminal 126*b* may contact the first anode terminal 126*a*.

FIGS. 3A to 3F are a view illustrating an assembly process of a top cap assembly and an electrode assembly according to an embodiment. A battery cell manufacturing process 300 may include an assembly process of the top cap assembly 120 and the jelly roll 106.

Figures 3A, 3B, 3C, 3D, 3E, 3F:
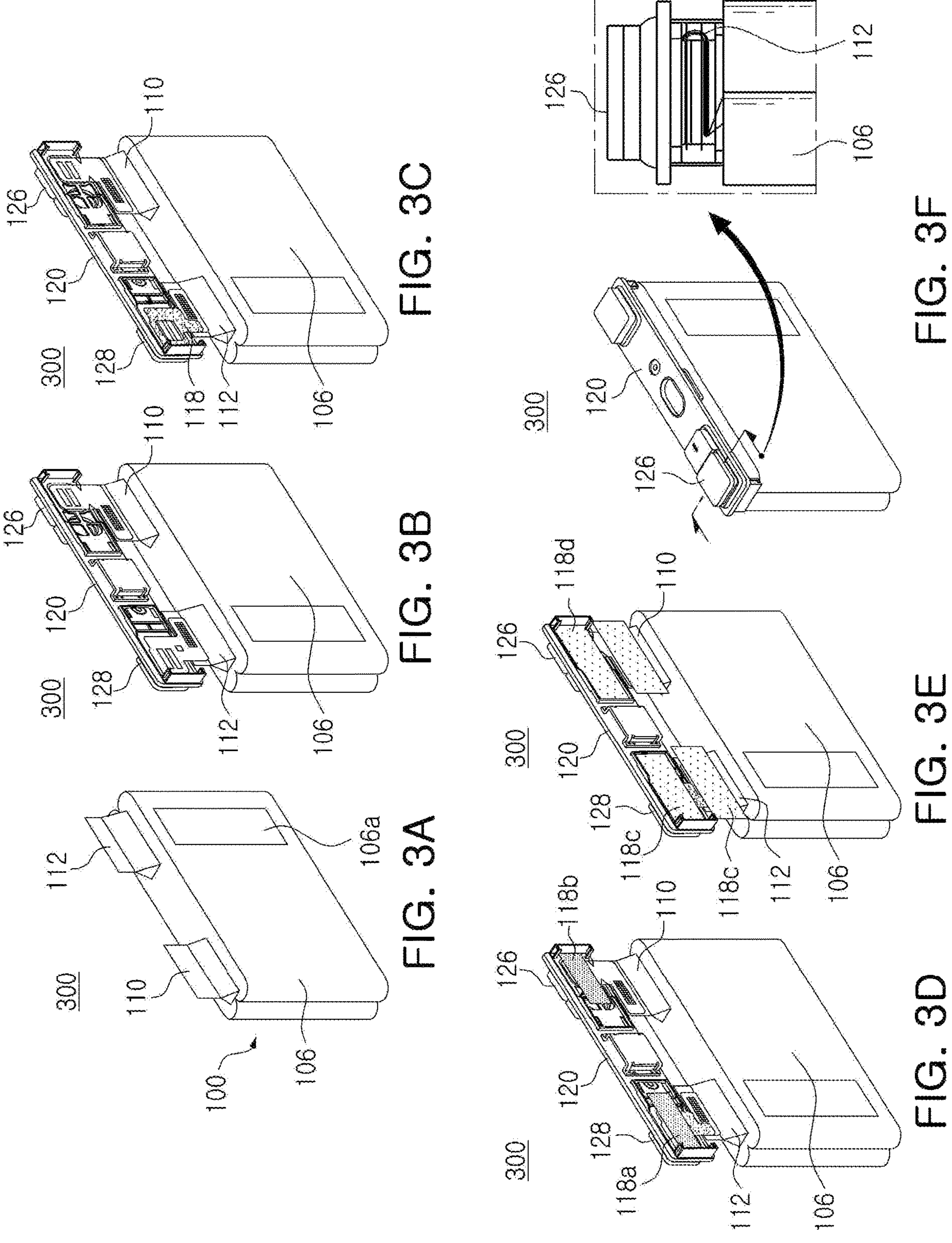
FIGS. 3A to 3F are a view for illustrating an assembly process of a top cap assembly and an electrode assembly according to one embodiment.

Referring to FIG. 3A, a sealing tape 106*a* may be attached to the jelly roll 106. According to an embodiment, the sealing tape 106*a* can cover at least a portion of the jelly roll 106. According to an embodiment, the sealing tape 106*a* may seal a portion of the jelly roll 106.

Referring to FIG. 3B, the jelly roll 106 may be connected to the top cap assembly 120. For example, a connection component for connecting the jelly roll 106 and the top cap assembly 120 may be prepared. The top cap assembly 120 may be closely attached to the jelly roll 106 using the connection component. For example, the cathode terminal 128 of the top cap assembly 120 may be connected to the cathode foil 112 of the jelly roll 106, and the anode terminal 126 of the top cap assembly 120 may be connected to the jelly roll 106. The cathode terminal 128 may be welded to the cathode foil 112 and the anode terminal 126 may be welded (e.g., ultrasonic-welded) to the anode foil 110.

Referring to FIG. 3C, at least a portion of the cathode terminal 128 may be masked. For example, the cathode connector mask 118 may be disposed to cover a portion of the cathode terminal 128. The cathode connector mask 118 may protect the cathode terminal 128. Although not shown, the description of the masking of the cathode terminal 128 may be applied to the anode terminal 126 as well.

Referring to FIG. 3D and/or FIG. 3E, tape may be attached to at least a portion of the cathode terminal 128 and the anode terminal 126. For example, the battery cell 100 may include welding tapes 118*a*, 118*b*, 118*c*, and 118*d* attached to at least a portion of the cathode terminal 128, the anode terminal 126, the cathode foil 112, and/or the anode foil 110. According to an embodiment, the welding tapes 118*a*, 118*b*, 118*c*, 118*d* may be attached to at least a portion of a joint portion of the cathode terminal 128, the anode terminal 126, the cathode foil 112, and/or the anode foil 110. As the joint portion is covered with the welding tapes 118*a*, 118*b*, 118*c*, and 118*d*, the cathode terminal 128 and the anode terminal 126 may be protected.

Referring to FIG. 3F, the anode foil 110 connected to the anode terminal 126 may be folded. For example, when the top cap assembly 120 is disposed on the jelly roll 106, at least a portion of the anode foil 110 may be folded. Although not shown, when the top cap assembly 120 is placed on the jelly roll 106, the cathode foil 112 may also be folded.

FIGS. 4A to 4F are a view illustrating an assembly process of an electrode assembly, a jelly roll bag, and a can. A battery cell manufacturing process 400 may include an assembly process of the jelly roll 106, the jelly roll bag 108, and the can 104.

Figures 4A, 4B, 4C, 4D, 4E, 4F:
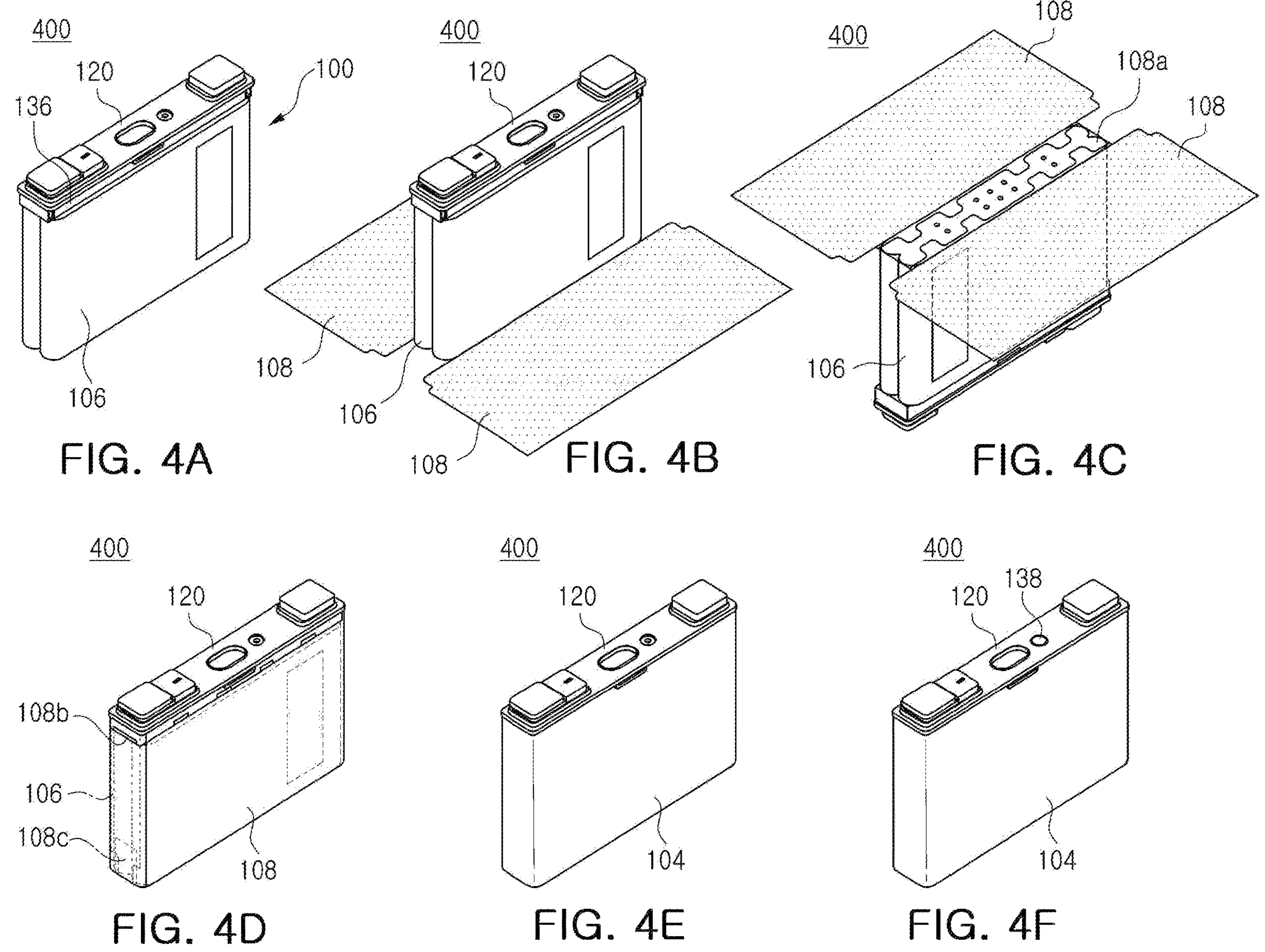
FIGS. 4A to 4F are a view for illustrating an assembly process of an electrode assembly, a jelly roll bag, and a can according to one embodiment.

Referring to FIG. 4A, an insulator 136 may be installed on the battery cell 100. For example, the insulator 136 may be disposed between the can 104 and the cap assembly 120.

Referring to FIG. 4B, the jelly roll bag 108 may be prepared. The jelly roll bag 108 may cover at least a portion (e.g., a side surface) of the jelly roll 106. The jelly roll 106 may be surrounded by the jelly roll bag 108. The jelly roll bag 108 may protect the jelly roll 106 from external impact. In FIG. 4B, a structure in which the jelly roll bag 108 is disposed on two side surfaces of the jelly roll 106 is shown, but the structure of the jelly roll bag 108 is not limited thereto. For example, according to an embodiment, the jelly roll bag 108 may be formed to cover four side surfaces of the jelly roll 106.

Referring to FIG. 4C, an insulator 108*a* may be attached to the jelly roll 106. According to an embodiment, in a state in which the jelly roll bag 108 is unfolded, the insulator 108*a* may be attached to a lower portion of the jelly roll 106. The insulator 108*a* may be referred to as a lower insulator.

Referring to FIG. 4D, at least some of the components of the battery cell 100 may be taped. For example, the battery cell 100 may include the top cap assembly 120, the can 104, and/or at least one first tape 108*b* attached onto insulator 136, and/or a second tape 108*c* attached to a lower portion of the jelly roll bag 108 along a side portion of the insulator 136.

Referring to FIG. 4E, the jelly roll 106 may be inserted into the can 104. The jelly roll 106 and/or the jelly roll bag 108 may be inserted into the can 104.

According to an embodiment, the battery cell manufacturing process 400 may include a wetting process of the jelly roll 106. For example, the jelly roll 106 may be initially wetted by an electrolyte delivered through an electrolyte injection port. For example, partial vacuum may be formed in the prismatic battery cell 100, and a predetermined amount of electrolyte may be injected through the electrolyte injection port. The partial vacuum may improve the distribution and wetting of all layers within the jelly roll 106. Wetting of all layers within the jelly roll 106 may require a rolling or spinning protocol to enhance wetting.

According to an embodiment, the battery cell manufacturing process 400 may include a quality check process for the initial wetting process, such as checking a weight of the prismatic battery cell 100 immediately after charging. For example, a second electrolyte charging operation in which an electrolyte is charged to achieve a desired weight may be applied to the battery cell. According to an embodiment, the battery cell manufacturing process 400 may include a preformation process of charging the prismatic battery cell 100 and discharging gas.

Referring to FIG. 4F, the electrolyte injection port may be sealed. For example, the electrolyte cap 138 may be inserted into the electrolyte injection port.

Figure 5A:
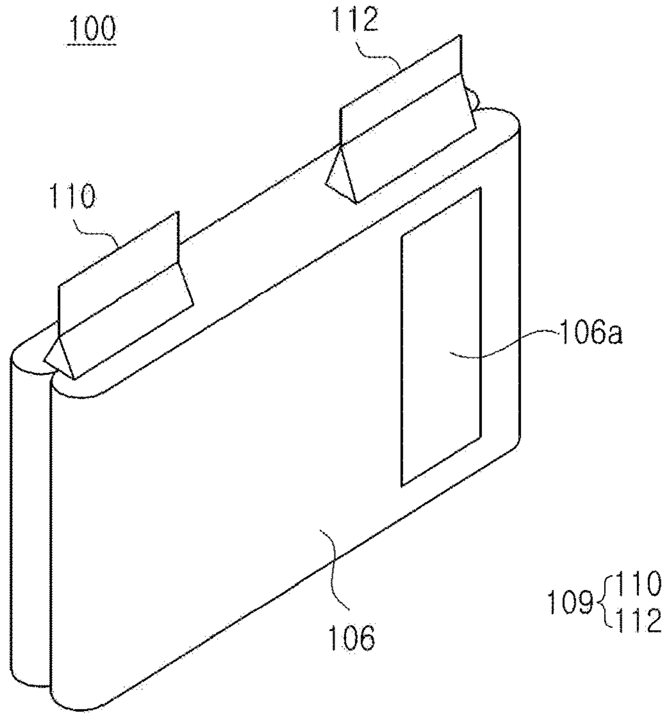
FIG. 5A is a perspective view of an electrode assembly including an electrode foil, according to one embodiment.
Figure 5B:
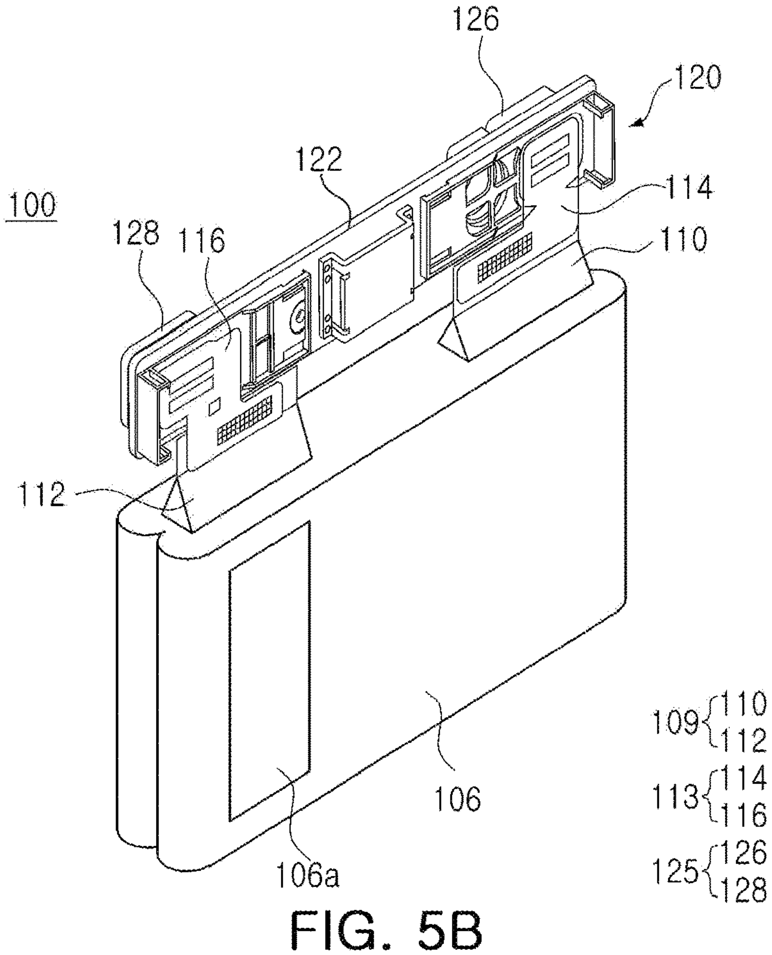
FIG. 5B is a perspective view illustrating a connection between an electrode foil and an electrode terminal on a top cap assembly, according to one embodiment.

FIG. 5A is a perspective view of an electrode assembly 106 including an electrode foil 109, according to embodiments. FIG. 5B is a perspective view illustrating a connection between the electrode foil 109 and an electrode terminal 125 on a top cap assembly 120, according to embodiments.

Referring to FIGS. 5A and 5B, a battery cell 100 may include jelly roll 106 and/or top cap assembly 120. The jelly roll 106 may be an example of an electrode assembly. Hereinafter, in this document and claims, the electrode assembly will be described using a jelly roll as an example, and is denoted by the same reference numeral "106."

FIG. 5A is a perspective view of an electrode assembly 106 including an electrode foil 109. The electrode foil 109 may include an anode foil 110 and a cathode foil 112. A sealing tape 106*a*, covering at least a portion of the electrode assembly 106, may be affixed to an outer surface of the electrode assembly 106.

FIG. 5B is a perspective view illustrating a connection between the electrode foil 109 and the electrode terminal 125 on a top cap assembly 120. The top cap assembly 120 may include a cap plate 122 and the electrode terminal 125. The electrode terminal 125 may include an anode terminal 126 and a cathode terminal 128. The electrode terminal 125 may be connected to the electrode foil 109. For example, the cathode foil 112 may be electrically connected to the cathode terminal 128, and the anode foil 110 may be electrically connected to the anode terminal 126. The electrode terminal 125 may be connected to the electrode foil 109 through a current collector 113. The current collector 113 may include an anode connector 114 and a cathode connector 116. The anode foil 110 may be connected to the anode terminal 126 (for example, the second anode terminal 126*b* in FIG. 2C) through the anode connector 114. The anode foil 110 and the anode connector 114 may be coupled to each other by welding (for example, ultrasonic welding or the like). The cathode foil 112 may be connected to the cathode terminal 128 (for example, the second cathode terminal 128*b* in FIG. 2C) through the cathode connector 116. The cathode foil 112 and the cathode connector 116 may be coupled to each other by welding (for example, ultrasonic welding or the like).

Figure 6A:
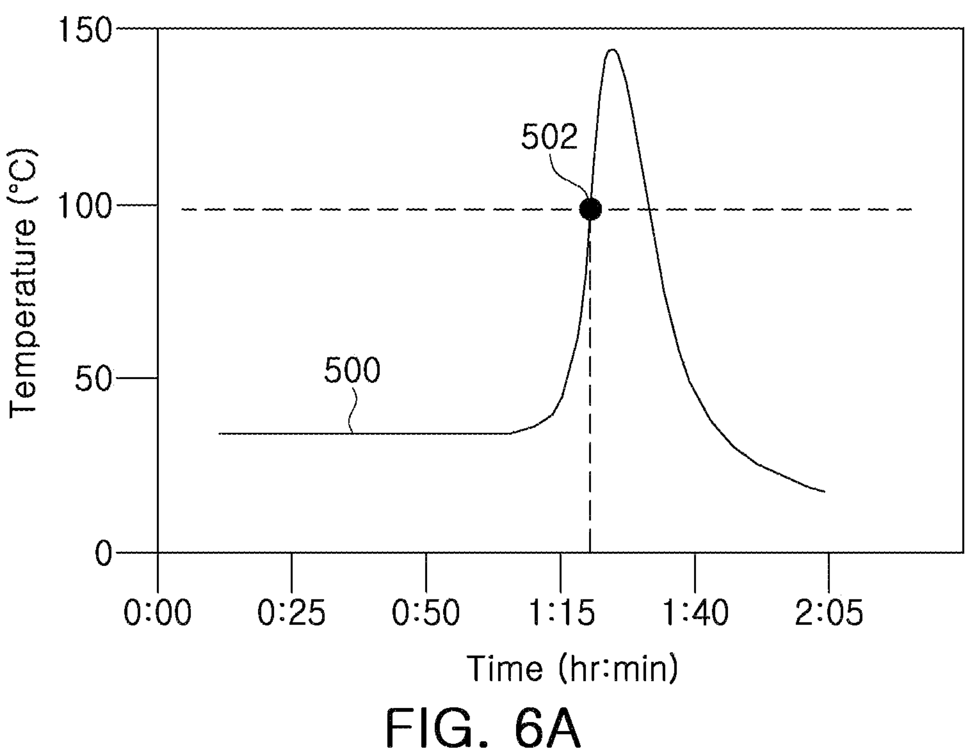
Figure 6B:
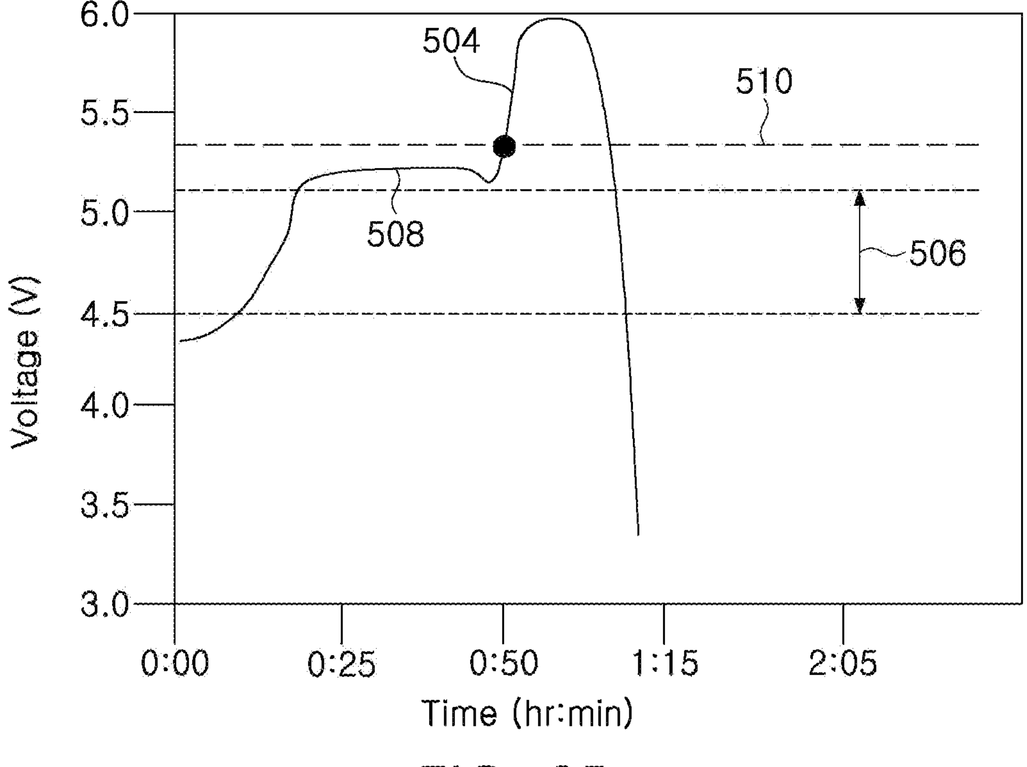

FIGS. 6A and 6B are graphs illustrating an overcharge state of a battery cell 100 according to one embodiment. FIG. 6A is a graph illustrating the temperature of a battery cell over time during an overcharge test, and FIG. 6B is a graph illustrating the voltage of a battery cell over time during an overcharge test.

FIG. 6A illustrates the temperature of a battery cell 100 (for example, a prismatic cell battery) over time during an overcharge test documented for "Failure mechanism of Li-ion battery at overcharge conditions" by Belov, et al. A temperature curve 500 remains relatively flat for the first 75 minutes before beginning to rise rapidly. This demonstrates that the heat rate of the battery cell surface does not increase in proportion to the applied current rate, but may be used as an indicator of an overcharge state. The heat rate (related to current), cell construction, and design are considered the main factors of Li-ion battery failure in overcharge. U.S. Ser. No. 11/245,163B2 illustrates an overcharge protection system that uses at least one current diverge device (CDD) that externally short-circuits a prismatic lithium-ion battery cell in response to an increase in pressure within the prismatic lithium ion battery cell. An example threshold 502 illustrates a potential triggering threshold based on the temperature of a battery cell that may be used to trigger an overcharge protection system. FIG. 6B illustrates the voltage of a battery cell 100 (for example, a prismatic battery cell) during an overcharge test performed by Belov. A voltage curve 504 rises from 4.4V through a safe operating range 506 before reaching a plateau 508 near 5.1V. For example, a threshold 510 is illustrated as a voltage that may trigger an overcharge safety device.

Figure 7A:
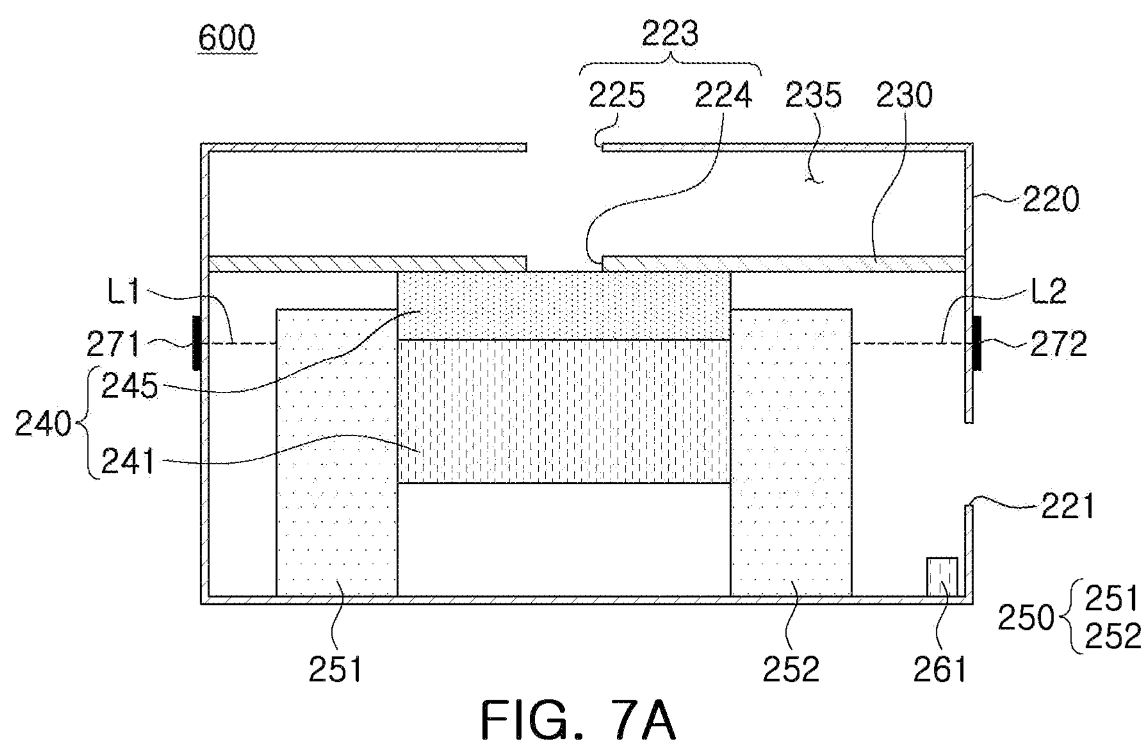
Figure 7B:
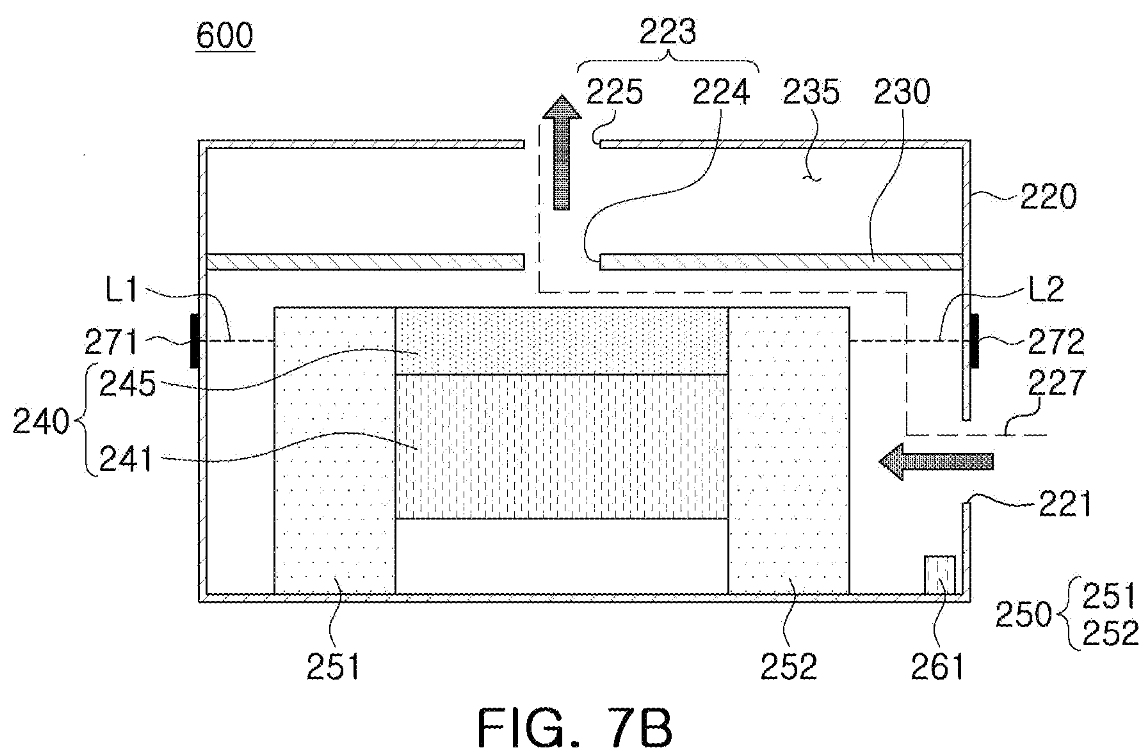
Figure 7C:
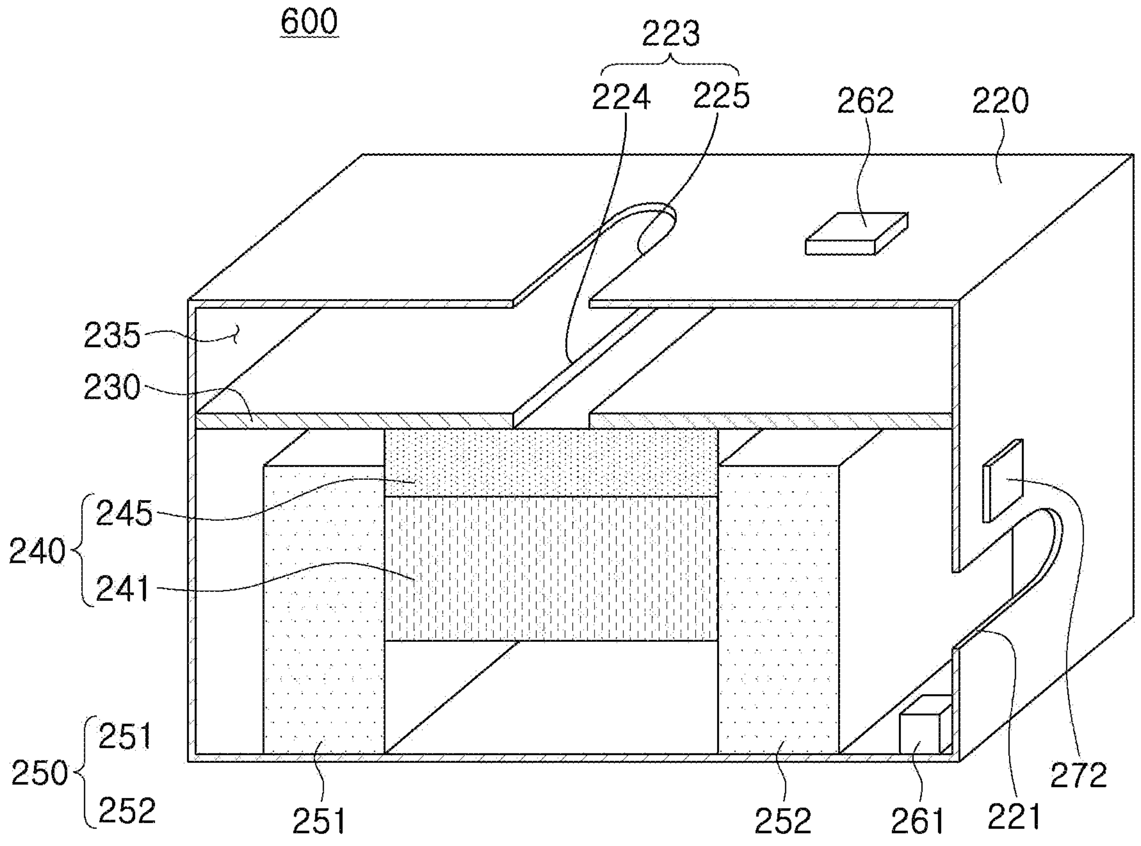

FIGS. 7A to 7C illustrate a Microelectromechanical System (MEMS)-based piezoelectric microvalve 600 according to one embodiment. "Development of MEMS-Based Piezoelectric Microvalve Technologies" by Yang, et al. demonstrates the use of MEMS-based piezoelectric microvalve 600 for both gas and liquids.

FIG. 7A is a cross-sectional view illustrating the MEMS-based piezoelectric microvalve 600 in the closed position. A casing 220 has an inlet 221 and an outlet-side opening 223. A partition wall 230 may be disposed in the internal space of the casing 220. The outlet-side opening 223 may include an outlet 224 disposed in the partition wall 230, and a communication hole 225 disposed in an outer surface of the casing 220. A buffer space 235 may be formed between the outlet 224 and the communication hole 225. An actuator 240 may regulate fluid flow between the inlet 221 and the outlet 224. The outlet 224 has a closed state when the actuator 240 is not operating, and may be opened when the actuator 240 is operating. The actuator 240 may include an actuator body 241 and a stopper 245. The actuator body 241 may include a piezoelectric element or a piezoelectric material. The stopper 245 may be a silicone (or other pliable air-stopping material) valve. The stopper 245 may contact the outlet 224 to close the outlet 224 or may be spaced apart from the outlet 224 to open the outlet 224. The actuator 240 may be driven by a power supply unit 250. The power supply unit 250 may include a first terminal 251 and a second terminal 252 having different polarities. For example, the first terminal 251 may have a negative (−) polarity, and the second terminal 252 may have a positive (+) polarity. The actuator body 241 may be connected to the first terminal 251 and the second terminal 252 of the power supply unit 250. The shape of the piezoelectric element or piezoelectric material provided on the actuator body 241 may be changed based on the amount of current passing between the first terminal 251 and the second terminal 252. A first lead inlet 271 and a second lead inlet 272 may receive power from the outside of the casing 220. The first lead inlet 271 may be electrically connected to the first terminal 251 through a first line L1, and the second lead inlet 272 may be electrically connected to the second terminal 252 through a second line L2. In the piezoelectric microvalve 600 in the closed position, since the stopper 245 closes the outlet 224, fluid flow between the inlet 221 and the outlet 224 may be blocked.

FIG. 7B illustrates the MEMS-based piezoelectric microvalve 600 in the open position. In this example, the piezoelectric element (piezoelectric material) 241 provided to the actuator body 241 contracts when current is applied, such that the stopper 245 may be retracted from the outlet 224. Accordingly, the gas (air) may move from the inlet 221 along a flow path 227 and may be discharged externally of the casing 220 through the outlet 224 and the communication hole 225 of the outlet-side opening 223.

In some embodiments, an optional sensor (a second sensor) 261 may be disposed near the inlet 221 to measure the temperature or pressure of the gas traveling along the flow path 227, and this optional sensor 261 may trigger the closing of the MEMS-based piezoelectric microvalve 600.

FIG. 7C is a partially cut-away perspective view illustrating the MEMS-based piezoelectric microvalve 600 integrated into a battery cell. The first lead inlet 271 supplies current to the first terminal 251 of the power supply unit 250, and the second lead inlet 272 supplies current to the second terminal 252 of the power supply unit 250. A current detector (a first sensor) 262 may be used to trigger the MEMS-based piezoelectric microvalve 600. The current detector 262 may be replaced with a voltage sensor, a temperature sensor, a pressure sensor that directly or indirectly detects pressure, or the like. For example, the optional sensor (the second sensor) 261 may be provided in place of or in conjunction with the current detector 262.

Figure 8:
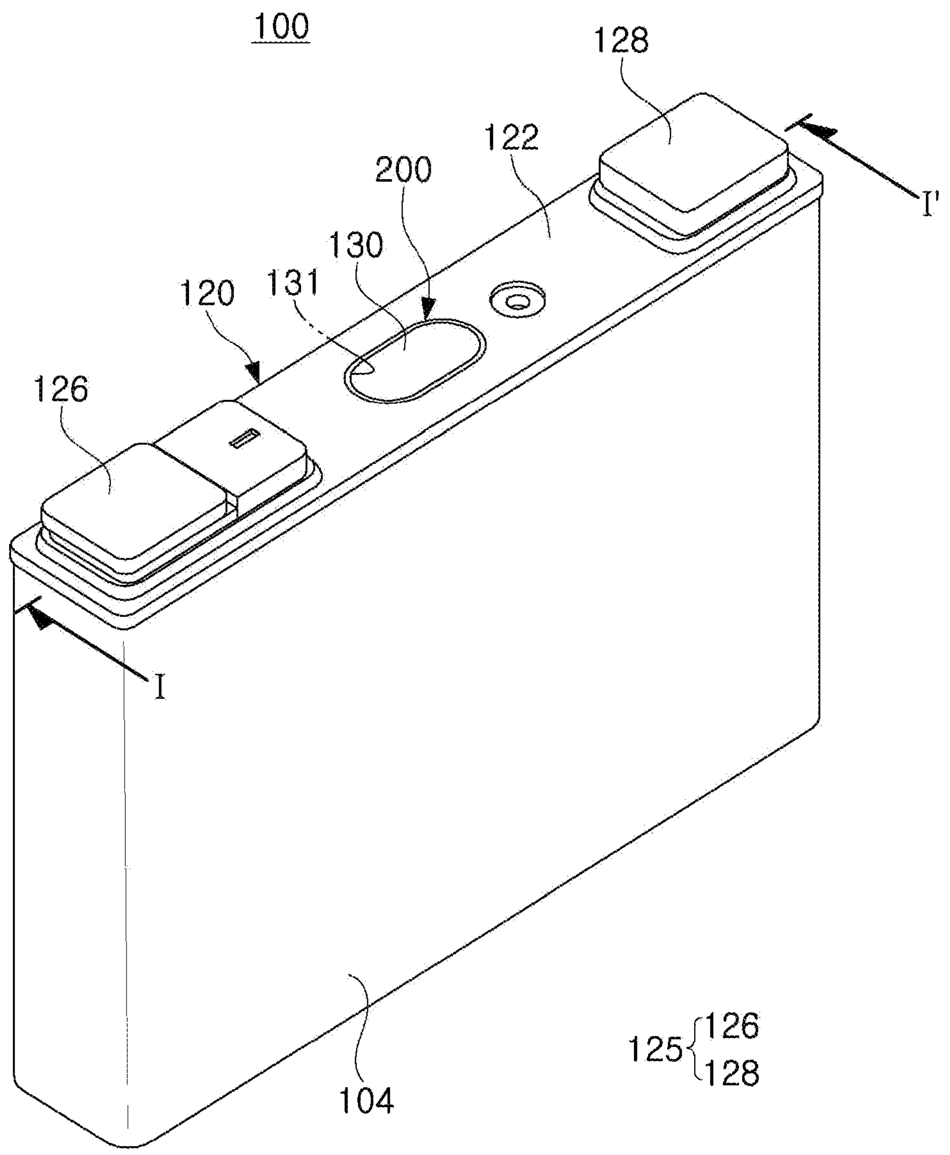
FIG. 8 is a perspective view of a battery cell according to one embodiment.
Figure 9A:
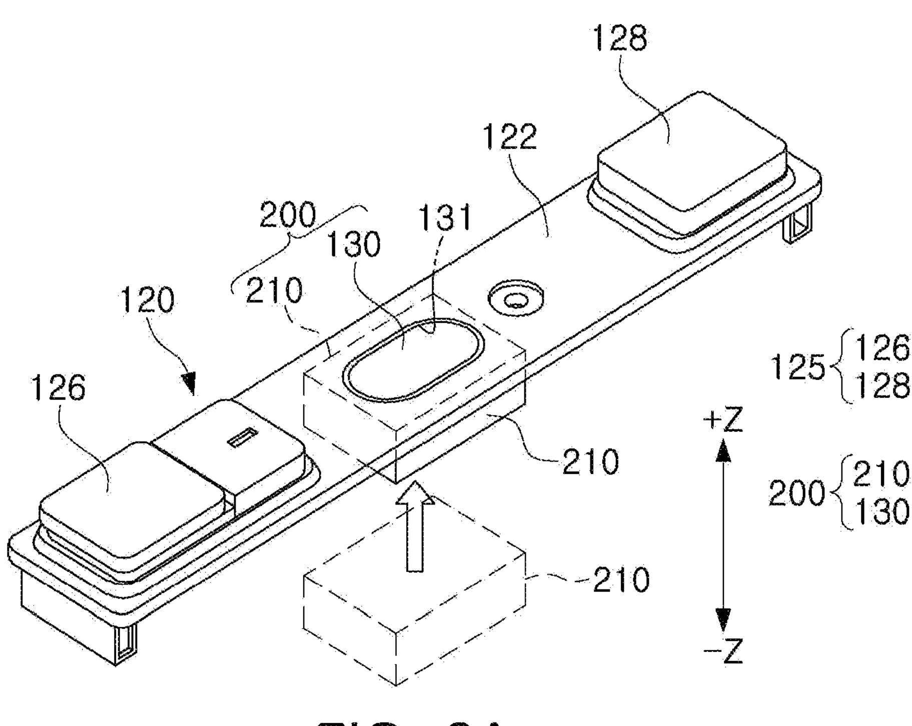
Figure 9B:
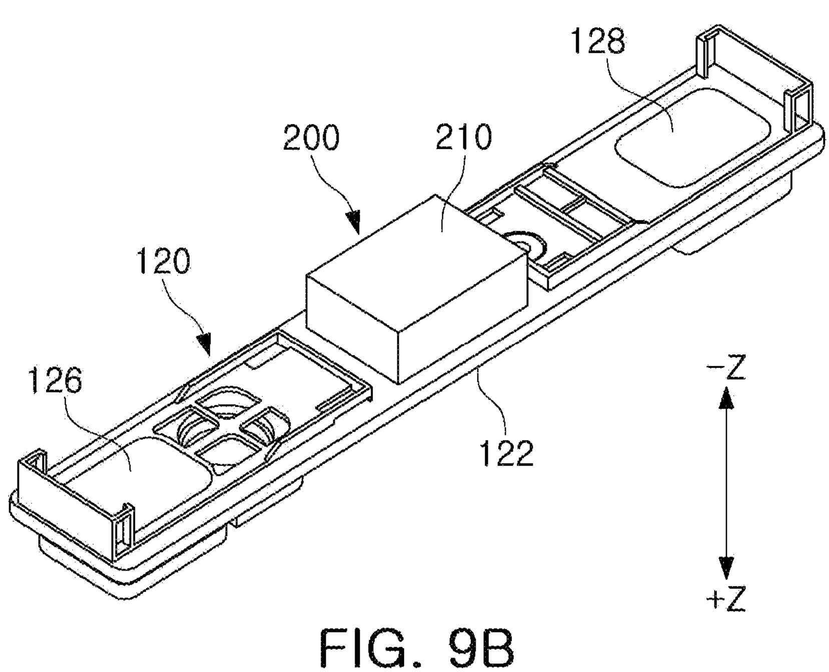

FIG. 8 is a perspective view of a battery cell according to embodiments. FIGS. 9A and 9B illustrate a top cap assembly 120 and a venting part 200 in the battery cell of FIG. 8, in which FIG. 9A is a perspective view of the venting part 200 viewed from above, and FIG. 9B is a perspective view of the venting part 200 viewed from the lower side.

Referring to FIGS. 8 to 9B, a battery cell 100 may include a case 104 accommodating an electrode assembly and a top cap assembly 120 covering the case 104. An electrode terminal 125 electrically connected to the electrode assembly may be disposed on a cap plate 122 of the top cap assembly 120. The electrode terminal 125 may include an anode terminal 126 and a cathode terminal 128. The battery cell 100 may include the venting part (venting member or venting valve) 200 through which gas inside the case 104 may be discharged externally. The venting part 200 may include an active venting device (active vent) 210.

The active venting device 210 may be opened to allow gas inside the case 104 to be discharged according to an electrical signal generated under a preset condition. The active venting device 210 may be triggered by at least one of a current threshold, a voltage threshold, a temperature threshold, and a pressure threshold. As an example, the active venting device 210 may be a piezoelectric microvalve or the MEMS-based piezoelectric microvalve 600 described with reference to FIGS. 7A to 7C. However, as long as the active venting device 210 operates according to electrical signals generated under preset conditions to discharge gas from inside the case 104 externally, various modifications are possible.

For example, the active venting device 210 may include a MEMS-based actuator or a MEMS-based piezoelectric actuator. A Microelectromechanical System (MEMS) is a three-dimensional structure in which sensors, signal circuits, actuators and the like are mounted on a single substrate. Inputs and outputs of MEMS may be configured in various manners such as various energies, mechanical displacements, and physical quantities in addition to electrical signals. For example, the input of MEMS may be formed of electrical signals, energy, mechanical displacement, physical quantities, optical signals, stoichiometric quantities, and the like, and the output of MEMS may also be formed of electrical signals, energy, mechanical displacement, physical quantities, optical signals, and stoichiometric quantities. Thus, the inputs and outputs of MEMS may be used in various combinations and for various uses. In an embodiment, when at least one of current, voltage, pressure, and temperature of the battery cell 100 exceeds a threshold value, the MEMS may be configured such that the gas is discharged by operating the actuator. In addition, since MEMS is mainly made using semiconductor microfabrication technology, the MEMS may be implemented in a very small size. Therefore, even when the MEMS-based actuator is installed inside the case 104 of the battery cell 100, energy density of the battery cell 100 may not be reduced.

In an embodiment, the active venting device 210 may include a MEMS-based piezoelectric actuator including a piezoelectric element (piezoelectric material) as described with reference to FIGS. 7A to 7C, but the driving method of the actuator is not limited to the piezoelectric method.

The venting part 200 may include a vent cover 130 covering a venting hole 131 in addition to the active venting device 210. The vent cover 130 may cover the venting hole 131. The venting hole 131 may be a passage through which high-pressure gas inside the case 104 escapes externally of the battery cell 100. The venting hole 131 and the vent cover 130 may be positioned on the cap plate 122, between the anode terminal 128 and the cathode terminal 126. However, the arrangement position of the venting hole 131 and the vent cover 130 is not limited to the cap plate 122 and may be disposed in the case 104. For example, the venting hole 131 and the vent cover 130 may be disposed on a lower surface of the case 104 or disposed on a side surface of the case 104.

The vent cover 130 may allow exhaust gas from the inside of the case to be discharged in a controlled direction and at a controlled pressure when the pressure inside the battery cell 100 increases. For example, the vent cover 130 may be activated at a pressure range of 10 to 15 bar. The vent cover 130 may be laser welded while covering the venting hole 131.

Figure 10:
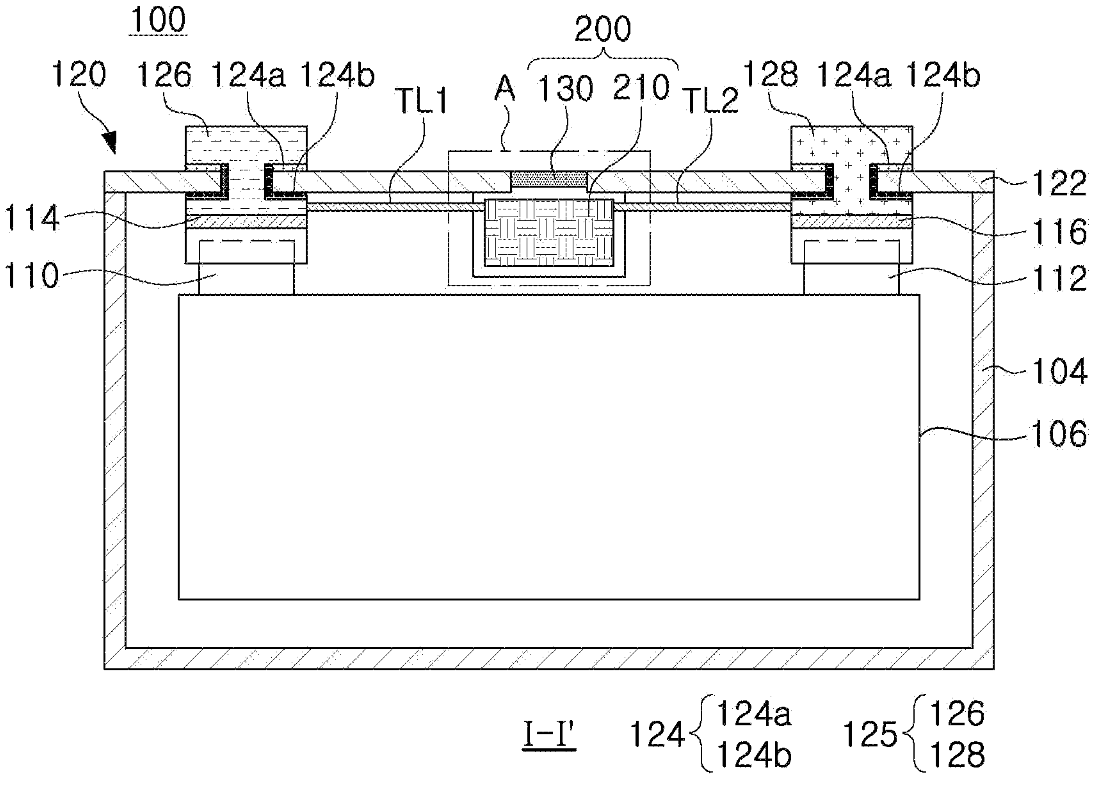
FIG. 10 is a cross-sectional view taken along line I-I' of FIG. 8.
Figure 11A:
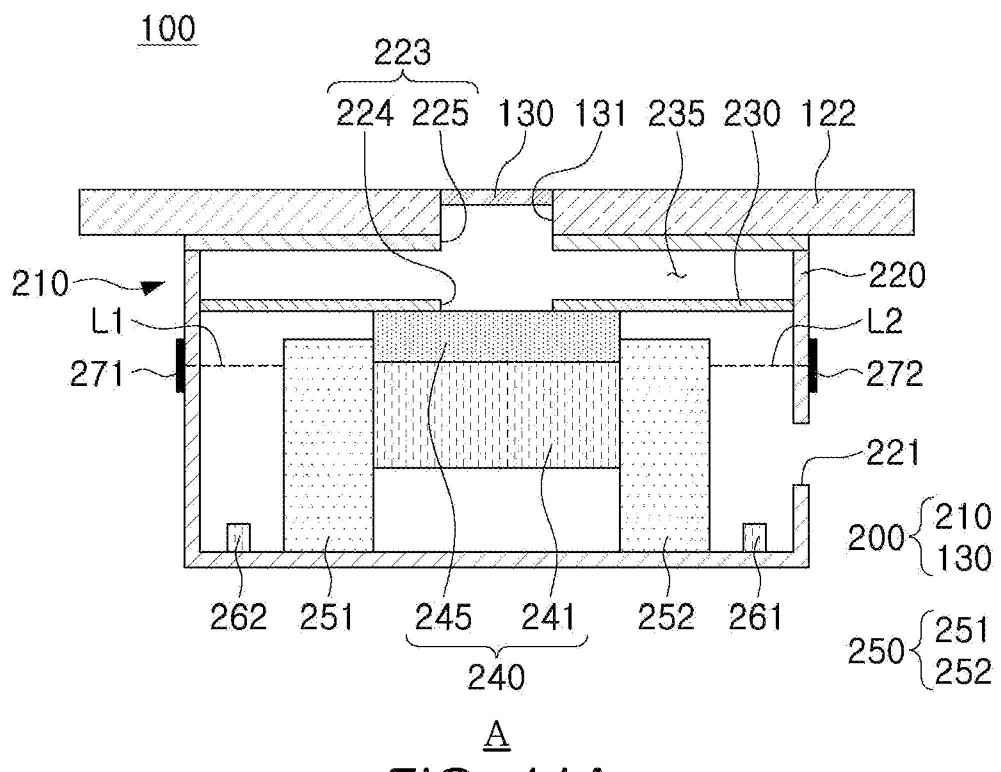
Figure 11B:
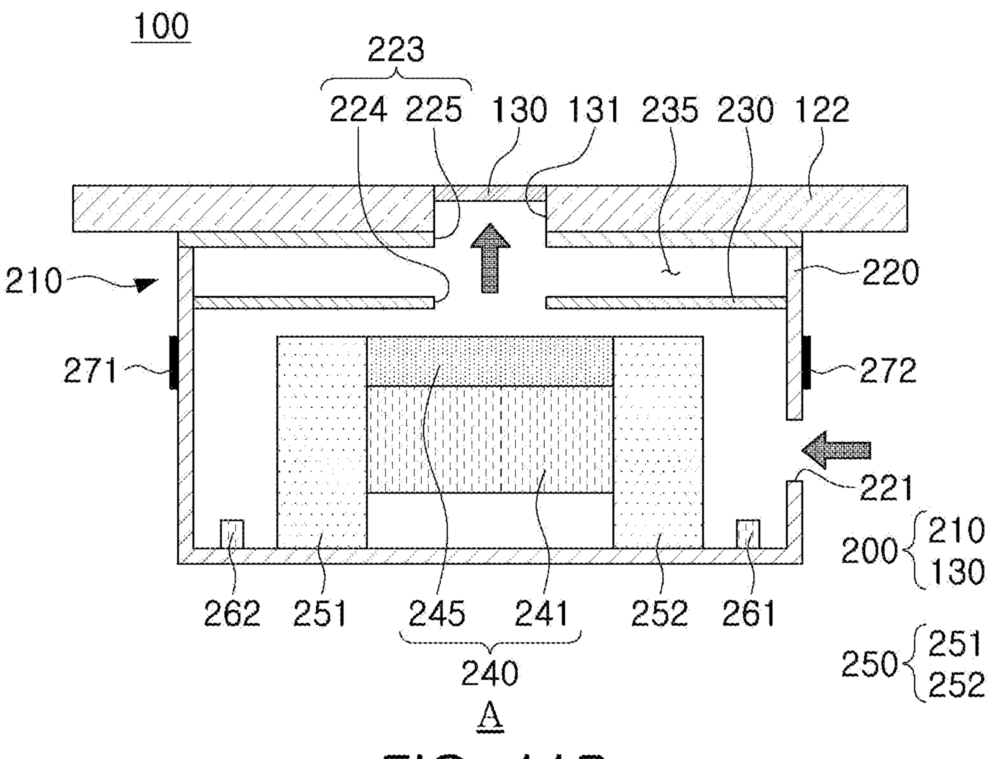

FIG. 10 is a cross-sectional view taken along line I-I' of FIG. 8. FIGS. 11A and 11B are enlarged views of part "A" in FIG. 10, in which FIG. 11A is a cross-sectional view illustrating an active venting device in a closed position and FIG. 11B is a cross-sectional view illustrating the active venting device in the open position.

Referring to FIG. 10, the battery cell 100 according to an embodiment may include a case 104 accommodating an electrode assembly 106 and a top cap assembly 120 covering the case 104.

The battery cell 100 may include an electrode terminal 125 electrically connected to the electrode assembly 106. The top cap assembly 120 may include a cap plate 122 and an electrode terminal 125. The electrode terminal 125 may be disposed inside and outside the case 104 by penetrating through the cap plate 122. The electrode terminal 125 may include an anode terminal 126 and a cathode terminal 128. The anode terminal 126 may be electrically connected to the anode foil 110 of the electrode assembly 106 through the anode connector 114. The cathode terminal 128 may be electrically connected to the cathode foil 112 of the electrode assembly 106 through the cathode connector 116.

An insulating member (upper insulator) 124 may be disposed between the electrode terminal 125 and the cap plate 122 for electrical insulation. The insulating member 124 may include a first insulating member 124*a* insulating between the upper surface of the cap plate 122 and the electrode terminal 125, and a second insulating member 124*b* insulating between the lower surface of the cap plate 122 and the electrode terminal 125. However, when the cap plate 122 has a polarity structure, one of the anode terminal 126 and the cathode terminal 128 may not include at least one of the first insulating member 124*a* and the second insulating member 124*b* (see FIG. 12).

The active venting device 210 may include an actuator (240 in FIG. 11A) operated by receiving power from the electrode terminal 125. Accordingly, the active venting device 210 may receive power from the inside of the battery cell 100 even if not connected to an external power source. The active venting device 210 may include a first link TL1 electrically connected to the anode terminal 126 and a second link TL2 electrically connected to the cathode terminal 128.

Referring to FIGS. 11A and 11B, the venting part 200 may include an active venting device 210 and a vent cover 130. Although the active venting device 210 illustrated in FIGS. 11A and 11B illustrates an example in which the MEMS-based piezoelectric microvalve 600 described with reference to FIGS. 7A to 7C is applied, the detailed structure and operation method of the active venting device 210 may be variously changed.

The active venting device 210 may include an inlet 221 into which gas generated inside the case 104 flows, an outlet 224 through which the gas introduced from the inlet 221 is discharged, and an actuator 240 operated to open the outlet 224. The actuator 240 may be disposed in the internal space of the casing 220. The inlet 221 and the outlet 224 may be formed on an inner or outer surface of the casing 220. Gas introduced from the inlet 221 may be discharged externally of the outlet 224 as the outlet 224 is opened.

A partition wall 230 may be disposed in the internal space of the casing 220. In this case, the outlet 224 may be disposed in the partition wall 230. When the partition wall 230 is disposed, the outlet-side opening 223 may include the outlet 224 disposed in the partition wall 230 and a communication hole 225 disposed in an outer surface of the casing 220.

A buffer space 235 accommodating gas discharged from the outlet 224 may be formed between the outlet 224 and the vent cover 130. The buffer space 235 may receive gas introduced through the inlet 221 when the outlet 224 is opened. For example, the buffer space 235 may reduce the pressure inside the case 104 by accommodating the gas inside the case 104. When the buffer space 235 is formed, the vent cover 130 may be opened when the pressure inside the buffer space 235 is greater than or equal to a set pressure. Accordingly, the buffer space 235 may adjust the timing at which the vent cover 130 is opened after the actuator 240 operates.

The actuator 240 may regulate fluid flow between the inlet 221 and the outlet 224. When the actuator 240 is not operating, the outlet 224 has a closed state (see FIG. 11A), and the outlet 224 may be opened when the actuator 240 is actuated (see FIG. 11B). The actuator 240 may include an actuator body 241 and a stopper 245. The actuator body 241 may include a piezoelectric element or a piezoelectric material. The stopper 245 may include a pliable material to seal the outlet 224. The stopper 245 may contact the outlet 224 to close the outlet 224 or may be spaced apart from the outlet 224 to open the outlet 224.

The active venting device 210 may include a power supply unit 250 that supplies power to the actuator 240. The power supply unit 250 may include a first terminal 251 and a second terminal 252 having different polarities. For example, the first terminal 251 may have a negative (−) polarity, and the second terminal 252 may have a positive (+) polarity. The first terminal 251 is connected to the first lead inlet 271 through the first line L1, and the second terminal 252 is connected to the second lead inlet 272 through the second line L2. The power supply unit 250 may be connected to the electrode terminal 125. As an example, the first lead inlet 271 may be connected to the anode terminal 126 by a first link (TL1 in FIG. 10), and the second lead inlet 272 may be connected to the cathode terminal 128 by the second link (TL2 in FIG. 10). Accordingly, the active venting device 210 may receive power from the electrode terminal 125 of the battery cell 100 even though the active venting device is not connected to an external power source.

The actuator body 241 may be connected to the first terminal 251 and the second terminal 252 of the power supply unit 250. The shape of the piezoelectric element or piezoelectric material provided in the actuator body 241 may be changed based on the amount of current passing between the first terminal 251 and the second terminal 252.

The active venting device 210 may further include a first sensor 262 that senses current flowing through the electrode terminal 125. The actuator 240 may be configured to operate when the current sensed by the first sensor 262 is greater than a threshold value. For example, when the actuator 240 is provided as a MEMS-based actuator, the actuator 240 may be operated by an electrical signal generated based on the input current value.

The first sensor 262 may be connected to the electrode terminal 125 to sense current flowing through the electrode terminal 125. For example, the first sensor 262 may be electrically connected to the anode terminal 126 and the cathode terminal 128, respectively.

On the other hand, the first sensor 262 may sense the voltage of the electrode terminal 125. The first sensor 262 may include both a sensor detecting current and a sensor detecting voltage, or may include a sensor detecting either current or voltage. For example, when the first sensor 262 detects the voltage, the actuator 240 may be configured to operate when the voltage sensed by the first sensor 262 is greater than a threshold value (e.g., 510 in FIG. 6B). For example, when the actuator 240 is provided as a MEMS-based actuator, the actuator 240 may operate by an electrical signal generated based on an input voltage value.

The active venting device 210 may include a second sensor 261 detecting at least one of pressure and temperature inside the case 104. The second sensor 261 may be installed at a position adjacent to the inlet 221 of the casing 220 to measure pressure and temperature around the inlet 221. The actuator 240 may be configured to operate when the pressure sensed by the second sensor 261 is greater than the threshold value or the temperature sensed by the second sensor 261 is greater than the threshold value (e.g., 502 in FIG. 6A). For example, when the actuator 240 is provided as a MEMS-based actuator, the actuator 240 may be operated by an electrical signal generated based on an input pressure value or an input temperature value.

At least one of the cap plate 122 and the case 104 may include a venting hole 131 through which gas inside the case 104 is discharged externally. The active venting device 210 may be disposed in the internal space of the case 104, and the outlet 224 of the active venting device 210 may be disposed to face the venting hole 224.

Referring to FIGS. 11A and 11B together with FIG. 10, the venting hole 131 is disposed between the anode terminal 126 and the cathode terminal 128, and the active venting device 210 may be disposed in a space between the anode foil 110 and the cathode foil 112 to face the venting hole 131. In this manner, when the active venting device 210 is disposed in the free (unoccupied) space between the anode foil 110 and the cathode foil 112, energy density reduction due to the installation of the active venting device 210 may be reduced.

A vent cover 130 covering the venting hole 131 may be disposed in the venting hole 131. The vent cover 130 may have a structure and/or shape that is broken or opened when the pressure acting on the vent cover 130 is equal to or greater than a set pressure. The outlet 224 of the active venting device 210 may be disposed to face the vent cover 130. In this case, when the outlet 224 of the active venting device 210 is closed, pressure inside the case 104 may not be transmitted to the vent cover 130.

Referring to FIG. 11B, when the outlet 224 of the active venting device 210 is opened, pressure acting on the vent cover 130 may increase. When the pressure acting on the vent cover 130 becomes a set pressure or higher, gas may be discharged through the vent cover 130.

When the active venting device 210 is triggered by the current threshold, overcharging may be notified to the battery management system (or controller) or a fault of the battery cell 100 may be notified thereto. For example, when the current detected by the first sensor 262 is greater than a threshold value, the active venting device 210 is triggered and the battery management system (or controller) may perform a current balancing process on the battery cell for which the active venting device 210 is triggered or the battery cell adjacent thereto. When the current detected by the first sensor 262 through this current balancing process is smaller than the threshold value, the active venting device 210 may return to a normal state. For example, the actuator 240 of the active venting device 210 may return to the initial position of FIG. 11A and may close the outlet 224.

On the other hand, when the buffer space 235 is installed, the buffer space 235 may accommodate the gas introduced through the inlet 221 when the active venting device 210 is triggered and the outlet 224 is opened, and thus, a sudden opening of the vent cover 130 may be restricted.

In other embodiments, the active venting device 210 may be triggered at a voltage threshold, temperature threshold, or pressure threshold. In any such embodiment, in the active venting device 210, when the temperature, pressure or voltage falls below the triggering threshold of the active venting device 210, the actuator 240 may be resettable to return to the closed state of FIG. 11A. However, when the pressure applied to the vent cover 130 after the active venting device 210 is activated is equal to or greater than the set pressure, gas may be discharged through the vent cover 130.

On the other hand, the first sensor 262 may consistently check the current (related to the high voltage of overcharging) flowing between the battery cell 100 and an external device, using a small amount of power from the electrode terminal 125 of the battery cell 100. When the current reaches a preset threshold (by any threshold current circuit of the related art), a small voltage may be generated to trigger the transistor such that the voltage may be applied to the MEMS-based piezoelectric actuator 240. The shape and size of the active venting device 210 needs to be appropriate for releasing pressure from the inside of the battery cell 100 to mitigate the negative effects of high pressure due to overcharging.

Figure 12:
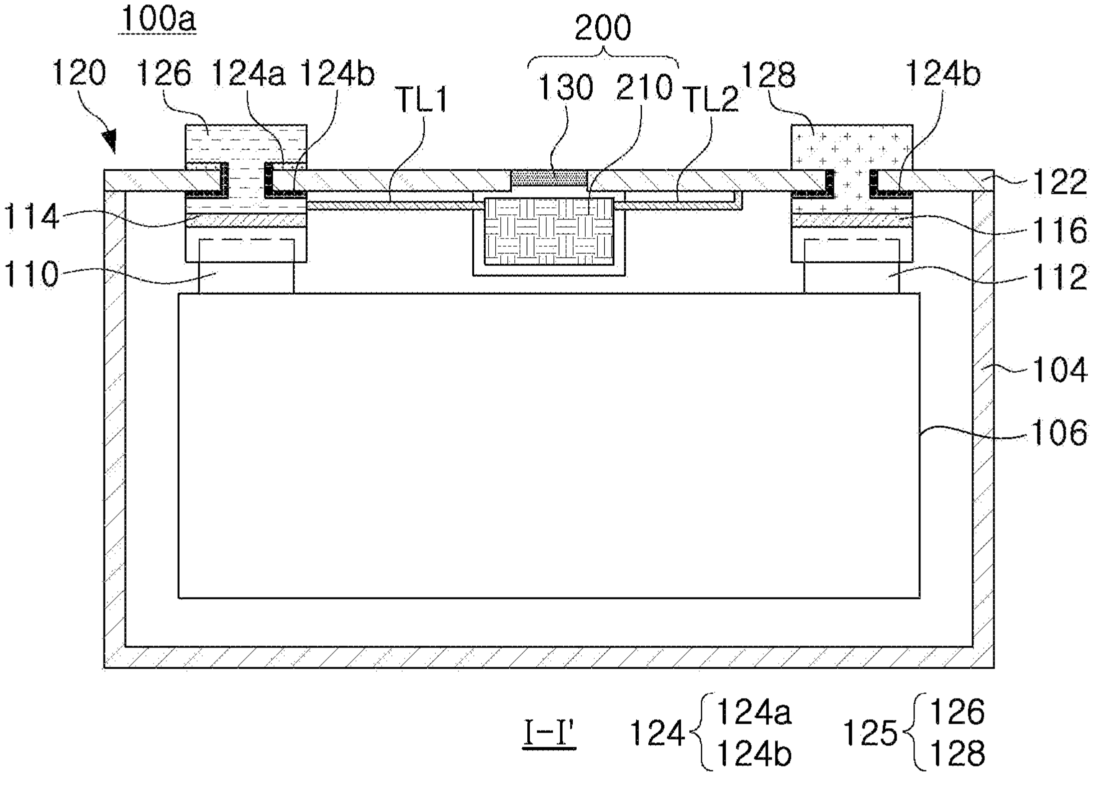
FIG. 12 is a cross-sectional view illustrating a modified example of FIG. 10.

FIG. 12 is a cross-sectional view illustrating a modified example of FIG. 10.

A battery cell **100*a* illustrated in FIG. 12 is different from the battery cell 100 illustrated in FIG. 10 in that one side of the second link TL2 is connected to the cap plate 122. The cap plate 122 and/or the case 104 of the battery cell 100*a* may have a polarity structure. In this case, the cap plate 122 may be electrically connected to one of the anode terminal 126 and the cathode terminal 128. For example, when the cap plate 122 has a positive (+) polarity, the cap plate 122 may be electrically connected to the cathode terminal 128. In this case, the anode terminal 126 is insulated from the cap plate 122 by the first insulating member 124*a* and the second insulating member 124*b*, while either one of the first insulating member 124*a* and the second insulating member 124*b* may not be disposed on the cathode terminal 128**.

As such, when the cap plate 122 and/or the case 104 are polarized, the active venting device 210 may be electrically connected to the electrode terminal 125 through the cap plate 122 and/or the case 104. Therefore, depending on the arrangement structure between the anode foil 110 or the cathode foil 112, the electrical connection structure between the active venting device 210 and the electrode terminal 125 may be easily changed.

Figure 13A:
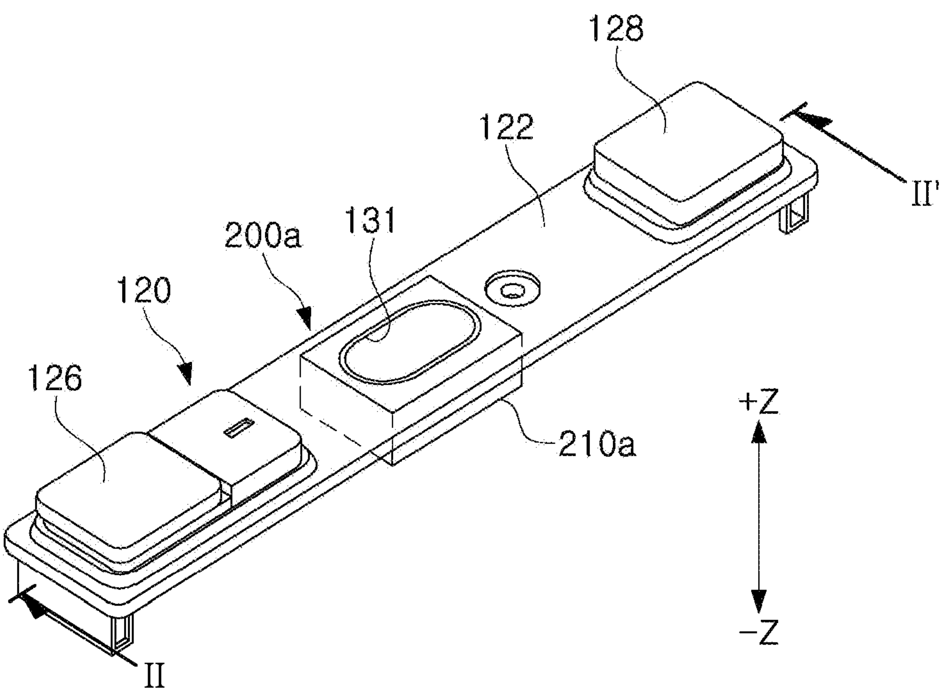
Figure 13B:
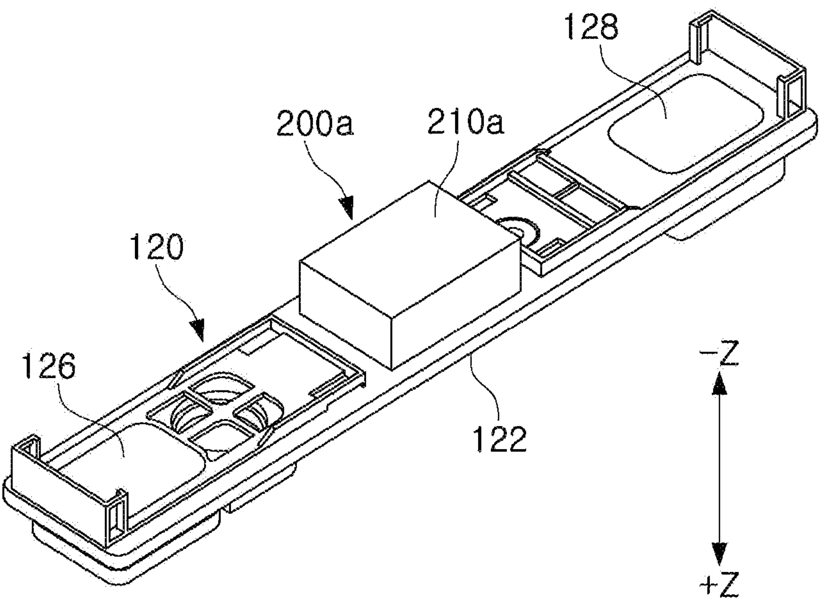
Figure 14:
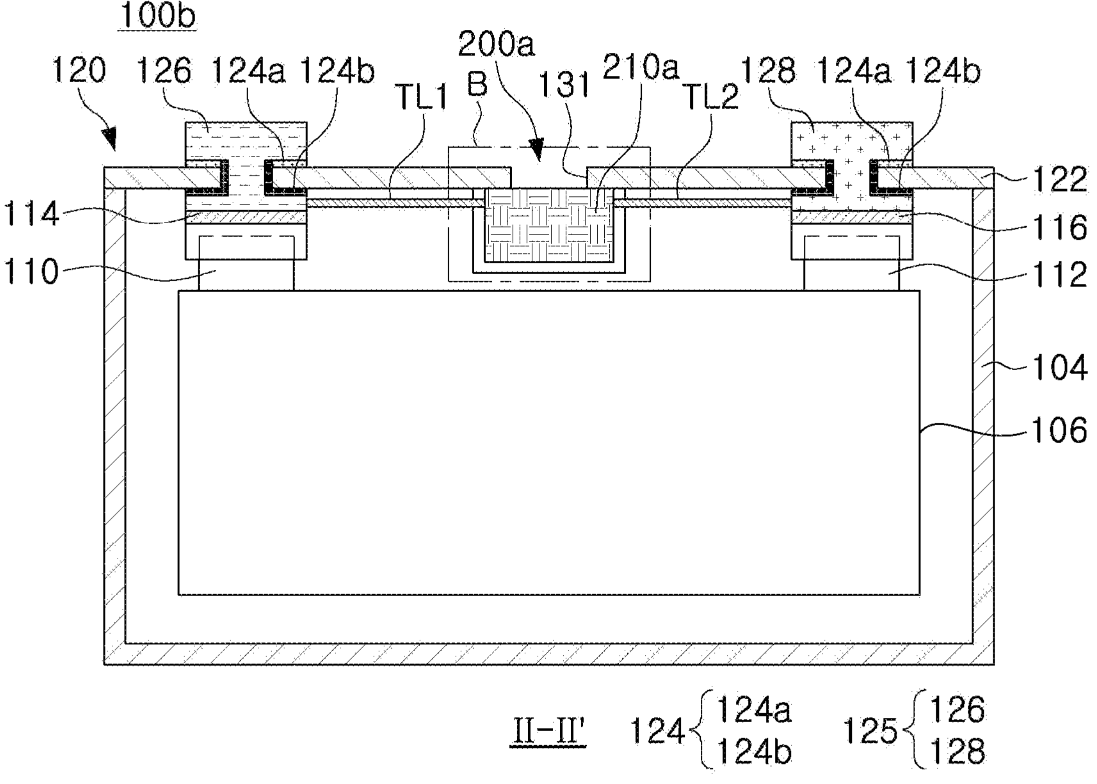
FIG. 14 is a cross-sectional view taken along line II-II' of FIG. 13.
Figure 15A:
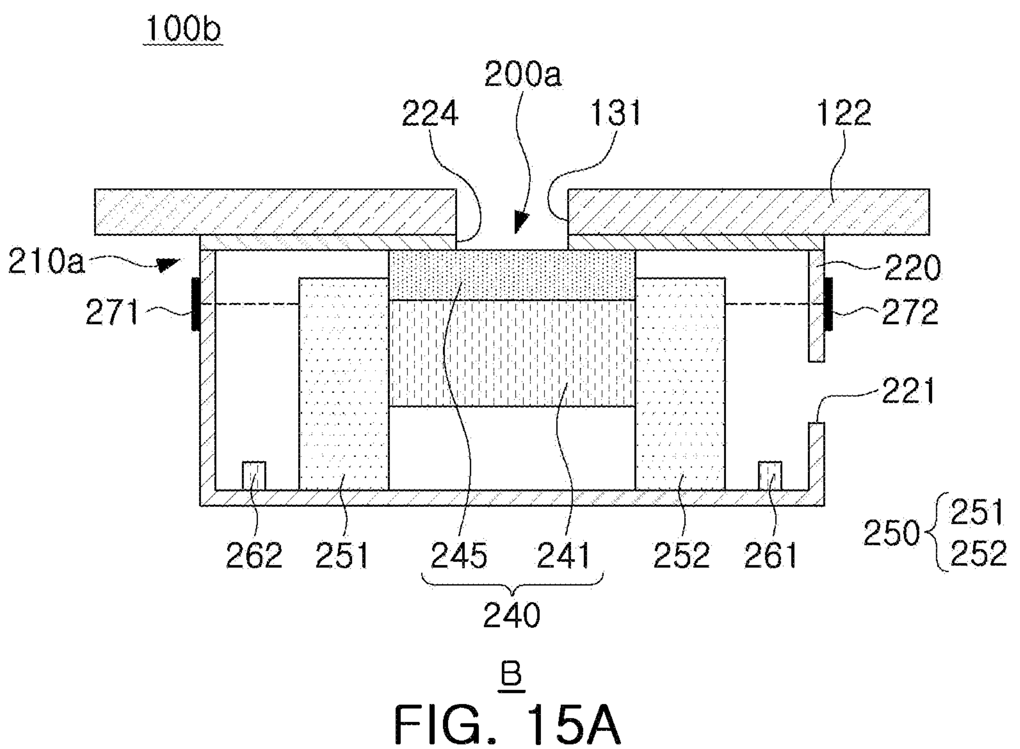
Figure 15B:
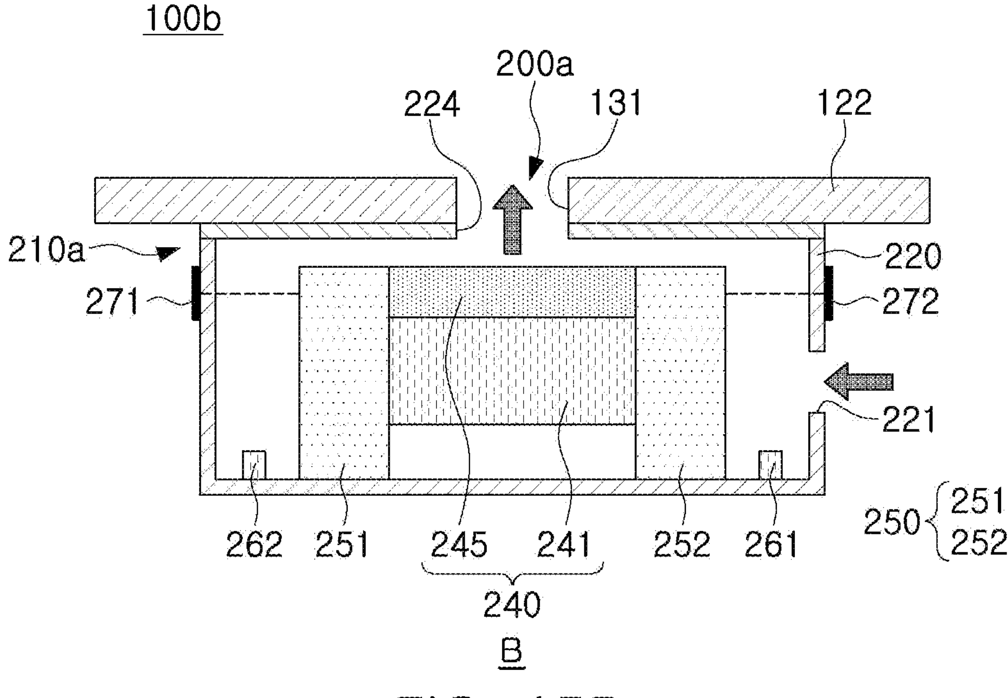

FIGS. 13A and 13B illustrate a modified example of a top cap assembly 120 and a venting part **200*a*, in which FIG. 13A is a perspective view as seen from the upper side, and FIG. 13B is a perspective view seen from the lower side. FIG. 14 is a cross-sectional view taken along line II-II' of FIG. 13. FIGS. 15A and 15B are enlarged views of part "B" of FIG. 14, in which FIG. 15A is a cross-sectional view illustrating an active venting device 210*a* in a closed position, and FIG. 15B is a cross-sectional view illustrating the active venting device 200*a*** in an open position.

A battery cell **100*b* illustrated in FIGS. 13A to 15B illustrates a modified example in which the vent cover 130 is not disposed in the venting hole 131. In the venting part 200*a* of the battery cell 100*b*, an active venting device 210*a* may be disposed in a venting hole 131** that is in an open state.

As compared with the battery cell 100 described with reference to FIGS. 8 to 11B, the battery cell **100*b* illustrated in FIGS. 13A to 15B has some differences in that the vent cover is not disposed, and in the shape of an outlet 224 of the casing 220**.

The battery cell 100*b* may include an inlet 221 into which gas generated inside the case 104 flows, the outlet 224 through which the gas introduced from the inlet 221 is discharged, and an actuator 240 operated to open the outlet 224. The outlet 224 is disposed to communicate with the venting hole 131 and is exposed to the outer space of the cap plate 122. Accordingly, the gas generated inside the case 104 may be discharged externally of the cap plate 122 through the venting hole 131 by opening the outlet 224.

As such, in one embodiments the venting part 200*a* may have a configuration including the active venting device 210*a* while not including the vent cover.

Figure 16:
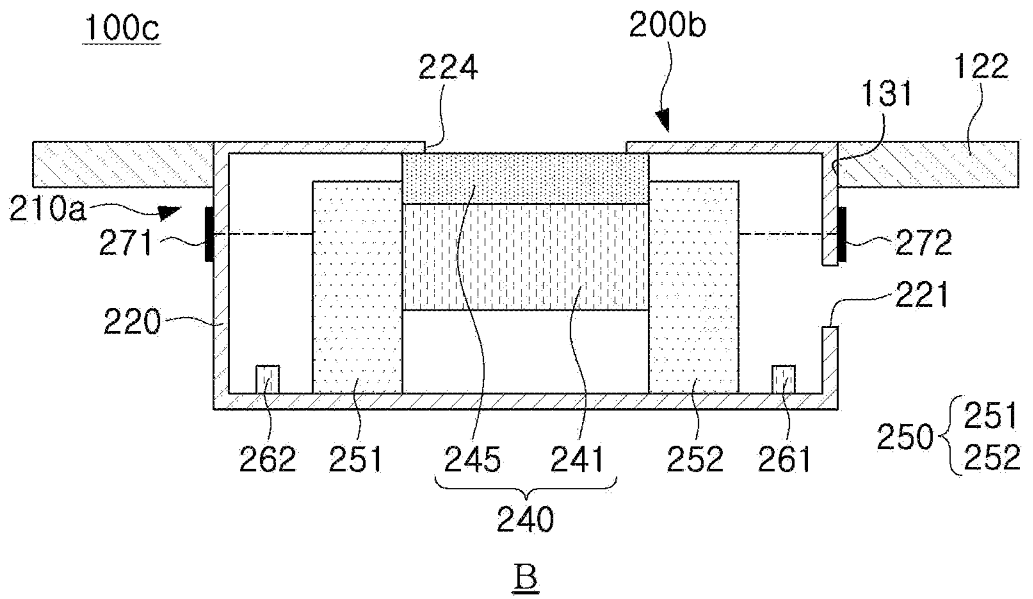
FIG. 16 is a cross-sectional view of a modified example of a venting part illustrated in FIG. 15A.

FIG. 16 is a cross-sectional view illustrating a modified example of the venting part illustrated in FIG. 15A.

The venting part 200*b* includes an active venting device 210*a*. As compared with the battery cell 100*b* illustrated in FIG. 15B, a battery cell 100*c* illustrated in FIG. 16 is different in the structure in which the active venting device 210*a* is disposed in the venting hole 131.

The active venting device 210*a* of the battery cell 100*c* may be installed to be exposed externally of the cap plate 122 through the venting hole 131. In this case, the casing 220 in which the inlet 221 and the outlet 224 are formed may be installed in the venting hole 131. The circumference of the casing 220 may be coupled while being inserted into the venting hole 131. When the actuator 240 of the active venting device 210*a* operates and the outlet 224 is opened, gas inside the case 104 may be discharged externally of the cap plate 122 through the outlet 224.

Figure 17:
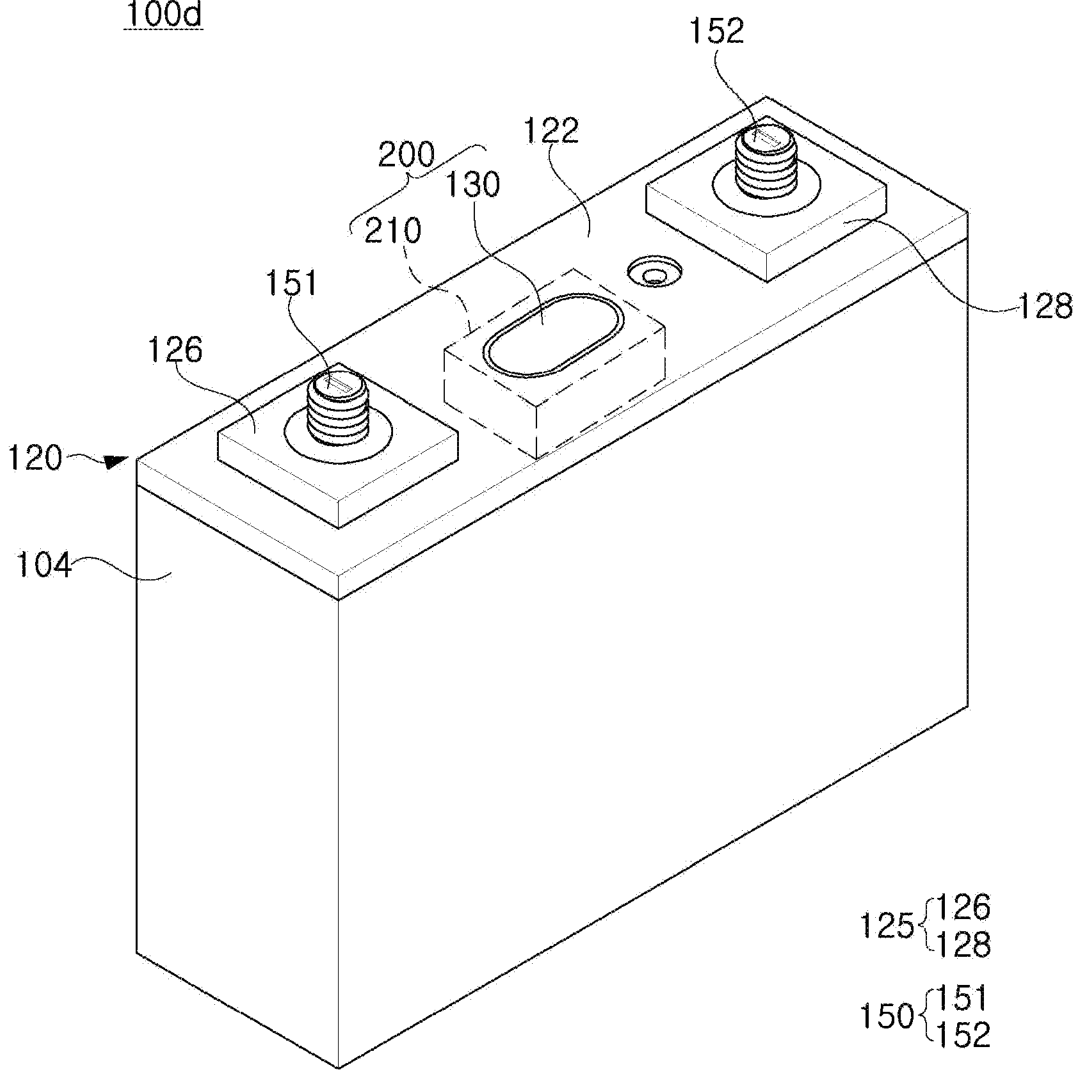
FIG. 17 is a perspective view illustrating a modified example of a battery cell.

FIG. 17 is a perspective view illustrating a modified example of a battery cell.

A battery cell 100*d* illustrated in FIG. 17 illustrates an example in which a terminal connector 150 is disposed on the electrode terminal 125. The terminal connector 150 may be manufactured in a state separated from the electrode terminal 125 and may be coupled to the electrode terminal 125, while may also be integrally formed with the electrode terminal 125. Also, the terminal connector 150 may have a nut shape as well as a bolt (screw) shape. An anode terminal connector 151 is connected to the anode terminal 126, and a cathode terminal connector 152 may be connected to the cathode terminal 128.

The terminal connector 150 may include a threaded screw-type connector. A lower portion of the terminal connector 150 may be connected to the electrode terminal 125 through screw coupling. An upper portion of the terminal connector 150 may be coupled with a nut-type external connector for electrical connection with an external circuit such as a bus bar or the like. In an embodiment, at least one of the anode terminal connector 151 and the cathode terminal connector 152 may be separated from the anode terminal 126 or the cathode terminal 128. Alternatively, the terminal connector 150 may be attached to the electrode terminal 125 through welding or the like. For example, the anode terminal connector 151 may be attached to the anode terminal 126 through ultrasonic welding. Similarly, the cathode terminal connector 152 may be attached to the cathode terminal 128 via ultrasonic welding.

Figure 18:
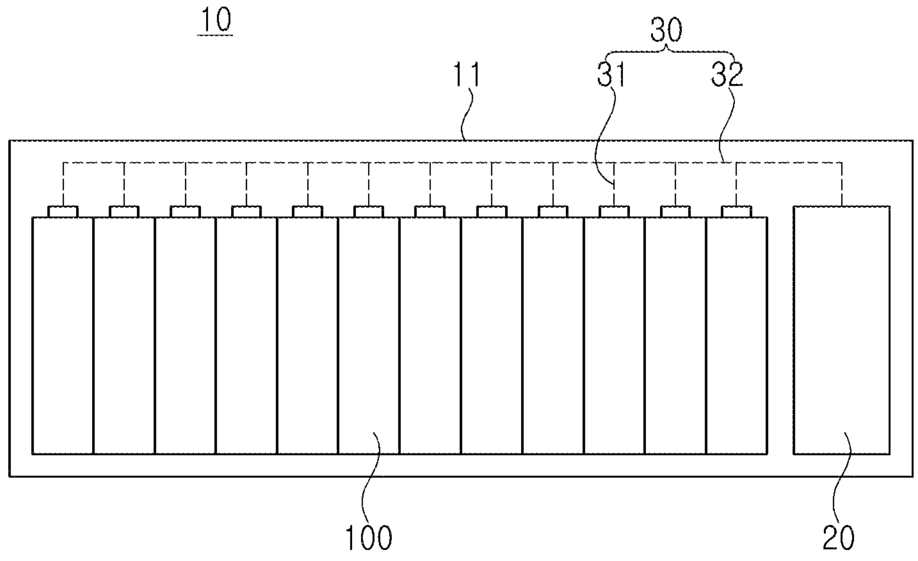
FIG. 18 is a schematic diagram of a battery device according to embodiments.

FIG. 18 is a schematic diagram of a battery device 10 according to embodiments.

Referring to FIG. 18, the battery device 10 may include a plurality of battery cells 100, a housing 11 accommodating the plurality of battery cells, and a controller 20. As described with reference to FIGS. 1 to 17, the plurality of battery cells may include battery cells 100, 100*a*, 100*b*, 100*c*, and 100*d* including active venting devices 210 and 210*a*. The active venting devices 210 and 210*a* may be opened to discharge gas from inside the case 104 according to electrical signals generated under preset conditions.

The controller 20 may include a battery management system (BMS) or may be configured as part of a battery management system. The controller 20 may be connected to at least one of the plurality of battery cells 100 through a signal line 30. The signal line 30 may include a first line 31 connected to the plurality of battery cells 100 and a second line 32 connected to the controller 20. The second line 32 may be comprised of a plurality of lines to detect the operation of the active venting devices 210 and 210*a* of the plurality of battery cells. The controller 20 may control the operation of at least one of the battery cells when the active venting devices 210 and 210*a* disposed in at least one of the plurality of battery cells 100 operate. For example, the controller 20 may detect that an abnormality has occurred in at least some battery cells according to a signal for operating the active venting devices 210 and 210*a*. Accordingly, the controller 20 may perform a series of controls for delaying or blocking occurrence of thermal runaway in the plurality of battery cells 100 disposed inside the battery device 10.

For example, the active venting devices 210 and 210*a* are configured to operate when the current sensed by the first sensor 262 is greater than a threshold value, and the controller 20 may perform current balancing with respect to at least some battery cells when the current sensed by the first sensor 262 is greater than a threshold value. In this case, the controller 20 may perform a current balancing process on the battery cell in which the active venting device 210 is triggered or a battery cell adjacent thereto. When the current detected by the first sensor 262 through this current balancing process is smaller than the threshold value, the active venting device 210 may return to a normal state. For example, the actuator 240 of the active venting device 210 may return to the initial position and close the outlet 224.

Functions performed in a process and method may be implemented in a different order. In addition, outlined steps and operations may be only provided as examples, and some of the steps and operations may be optional, combined into fewer steps and operations, or expanded into additional steps and operations without detracting from the essence of the disclosed embodiments.

Only specific examples of implementations of certain embodiments are described. Variations, improvements and enhancements of the disclosed embodiments and other embodiments may be made based on the disclosure of this patent document.

In addition, although this document has been described using a prismatic battery cell as an example, it may be applied to a cylindrical battery cell or a coin-type battery cell.

What is claimed is:

1. A battery cell comprising:

a case accommodating an electrode assembly;

a cap plate covering the case;

an electrode terminal disposed on the cap plate and electrically connected to the electrode assembly; and a venting part comprising a valve including an active venting device configured to be opened to discharge gas from inside the case according to an electrical signal generated under a preset condition, wherein the active venting device includes a casing having an inlet through which gas generated inside the case is introduced, and an outlet through which the gas introduced from the inlet is discharged, the outlet in contact with a stopper of the valve for closure of the outlet, and the inlet and the outlet are disposed in directions intersecting each other.

2. The battery cell of claim 1, wherein the active venting device further includes a Micro-Electro-Mechanical System (MEMS)-based actuator or a MEMS-based piezoelectric actuator.

3. The battery cell of claim 1, wherein the valve comprises a piezoelectric microvalve or a MEMS-based piezoelectric microvalve.

4. The battery cell of claim 1, wherein the active venting device further includes an actuator configured to operate by receiving power from the electrode terminal.

5. The battery cell of claim 1, wherein the active venting device further includes an actuator configured to operate to open the outlet, and a power supply unit supplying power to the actuator, wherein the power supply unit is electrically connected to the electrode terminal.

6. The battery cell of claim 5, wherein the active venting device further includes a first sensor configured to sense current flowing through the electrode terminal, and the actuator is configured to operate when the current sensed by the first sensor is greater than a threshold value.

7. The battery cell of claim 6, wherein the electrode terminal includes an anode terminal and a cathode terminal, and the first sensor is electrically connected to the anode terminal and the cathode terminal, respectively.

8. The battery cell of claim 5, wherein the active venting device further includes a first sensor configured to sense a voltage of the electrode terminal, and the actuator is configured to operate when the voltage sensed by the first sensor is greater than a threshold value.

9. The battery cell of claim 5, wherein the active venting device further includes a second sensor configured to sense at least one of pressure and temperature inside the case, and the actuator is configured to operate when the pressure or the temperature sensed by the second sensor is greater than a threshold value.

10. The battery cell of claim 1, wherein at least one of the cap plate and the case includes a venting hole through which the gas inside the case is discharged externally, and the active venting device is disposed in an internal space of the case.

11. The battery cell of claim 10, wherein the outlet of the active venting device is disposed to face the venting hole.

12. The battery cell of claim 10, wherein the active venting device further includes an actuator operating to open the outlet, wherein the gas generated inside the case is discharged externally through the venting hole by opening the outlet.

13. The battery cell of claim 10, wherein the electrode terminal includes an anode terminal connected to an anode foil of the electrode assembly and a cathode terminal connected to a cathode foil of the electrode assembly, the venting hole is disposed between the anode terminal and the cathode terminal, and the active venting device is disposed in a space between the anode foil and the cathode foil, to face the venting hole.

14. The battery cell of claim 1, wherein at least one of the cap plate and the case includes a venting hole through which the gas inside the case is discharged externally, and the active venting device is installed to be exposed externally of the cap plate or the case through the venting hole.

15. The battery cell of claim 14, wherein the active venting device further includes an actuator accommodated inside the casing and configured to operate to open the outlet, wherein the casing is installed in the venting hole.

16. A battery cell comprising:

a case accommodating an electrode assembly;

a cap plate covering the case;

an electrode terminal disposed on the cap plate and electrically connected to the electrode assembly; and a venting part including an active venting device configured to be opened to discharge gas from inside the case according to an electrical signal generated under a preset condition, wherein at least one of the cap plate and the case includes a venting hole through which the gas inside the case is discharged externally, the active venting device is disposed in an internal space of the case, the venting part includes the active venting device and a vent cover covering the venting hole, and an outlet of the active venting device is disposed to face the vent cover.

17. The battery cell of claim 16, wherein the active venting device includes an inlet through which the gas generated inside the case is introduced, and an actuator operating to open the outlet, wherein the outlet is configured to discharge the gas introduced from the inlet, and wherein, between the outlet and the vent cover, a buffer space is provided to accommodate the gas discharged from the outlet.

18. The battery cell of claim 17, wherein the vent cover is opened when pressure inside the buffer space is equal to or greater than a set pressure.

19. A battery device comprising:

a plurality of battery cells;

a housing accommodating the plurality of battery cells; and a controller connected to at least one of the plurality of battery cells and controlling at least one of the plurality of battery cells, wherein the plurality of battery cells include a case accommodating an electrode assembly, a cap plate covering the case, an electrode terminal disposed on the cap plate and electrically connected to the electrode assembly, and a venting part including an active venting device configured to be opened to discharge gas from inside the case according to an electrical signal generated under a preset condition, the controller controls an operation of at least one of the battery cells when the active venting device disposed in at least one of the plurality of battery cells operates, the active venting device includes an inlet through which the gas generated inside the case is introduced, an outlet through which the gas introduced from the inlet is discharged, an actuator configured to operate to open the outlet, and a first sensor configured to sense current flowing through the electrode terminal, the actuator is configured to operate when the current sensed by the first sensor is greater than a threshold value, and the controller performs current balancing for at least one of the plurality of battery cells when the current sensed by the first sensor is greater than the threshold value.

* * * * *